United States Patent
Zhang et al.

(10) Patent No.: US 11,507,498 B2
(45) Date of Patent: Nov. 22, 2022

(54) PRE-COMPUTATION OF MEMORY CORE CONTROL SIGNALS

(71) Applicant: SanDisk Technologies LLC, Addison, TX (US)

(72) Inventors: Yuheng Zhang, Saratoga, CA (US); Yan Li, Milpitas, CA (US)

(73) Assignee: SanDisk Technologies LLC, Addison, TX (US)

(*) Notice: Subject to any disclaimer, the term of this patent is extended or adjusted under 35 U.S.C. 154(b) by 205 days.

(21) Appl. No.: 16/810,243

(22) Filed: Mar. 5, 2020

(65) Prior Publication Data

US 2021/0279168 A1 Sep. 9, 2021

(51) Int. Cl.
*G06F 12/02* (2006.01)
*G06F 12/0877* (2016.01)
(Continued)

(52) U.S. Cl.
CPC ............ *G06F 12/0246* (2013.01); *G06F 1/24* (2013.01); *G06F 9/30189* (2013.01);
(Continued)

(58) Field of Classification Search
CPC .... G06F 12/0246; G06F 1/24; G06F 9/30189; G06F 9/44505; G06F 12/0877; G06F 13/1689; G06F 2212/7206; G06F 1/3275; G11C 11/5628; G11C 16/0483; G11C 16/08; G11C 16/10; G11C 16/20;
(Continued)

(56) References Cited

U.S. PATENT DOCUMENTS 4,313,158 A * 1/1982 Porter ................. G06F 12/0859
711/140
5,509,134 A 4/1996 Fandrich et al.
(Continued)

FOREIGN PATENT DOCUMENTS

EP 2211271 A2 7/2010
EP 1636695 3/2011

OTHER PUBLICATIONS

U.S. Appl. No. 16/906,233, filed Jun. 19, 2020.
(Continued)

*Primary Examiner* — Yaima Rigol
*Assistant Examiner* — Wei Ma
(74) *Attorney, Agent, or Firm* — Vierra Magen Marcus LLP

(57) ABSTRACT

An apparatus including a memory structure comprising non-volatile memory cells and a microcontroller. The microcontroller is configured to output Core Timing Control (CTC) signals that are used to control voltages applied in the memory structure. In one aspect, information from which the CTC signals may be generated is pre-computed and stored. This pre-computation may be performed in a power on phase of the memory system. When a request to perform a memory operation is received, the stored information may be accessed and used to generate the CTC signals to control the memory operation. Thus, considerable time and/or power is saved. Note that this time savings occurs each time the memory operation is performed. Also, power is saved due to not having to repeatedly perform the computation.

16 Claims, 19 Drawing Sheets

(51) Int. Cl.
  *G06F 1/24* (2006.01)
  *G06F 9/30* (2018.01)
  *G06F 9/445* (2018.01)
  *G06F 13/16* (2006.01)

(52) U.S. Cl.
  CPC ...... *G06F 9/44505* (2013.01); *G06F 12/0877* (2013.01); *G06F 13/1689* (2013.01)

(58) Field of Classification Search
  CPC ..... G11C 16/32; G11C 16/3459; G11C 7/222; Y02D 10/00
  See application file for complete search history.

(56) References Cited

U.S. PATENT DOCUMENTS

| | | |
|---|---|---|
| 6,345,348 B2 | 2/2002 | Watanabe et al. |
| 6,393,561 B1 | 5/2002 | Hagiwara et al. |
| 6,545,891 B1 | 4/2003 | Tringali et al. |
| 6,721,843 B1 | 4/2004 | Estakhri |
| 6,754,765 B1 | 6/2004 | Chang et al. |
| 6,754,828 B1 | 6/2004 | Marisetty et al. |
| 6,765,813 B2 | 7/2004 | Scheuerlein et al. |
| 6,772,276 B2 | 8/2004 | Dover |
| 7,574,611 B2 | 8/2009 | Cohen |
| 7,594,055 B2 | 9/2009 | Gower et al. |
| 7,600,090 B2 | 10/2009 | Cohen et al. |
| 7,620,784 B2 | 11/2009 | Panabaker |
| 7,676,640 B2 | 3/2010 | Chow et al. |
| 7,788,553 B2 | 8/2010 | Chow et al. |
| 7,822,912 B2 | 10/2010 | Pua |
| 8,074,022 B2 | 12/2011 | Okin et al. |
| 8,127,113 B1 | 2/2012 | Sinha |
| 8,131,915 B1 | 3/2012 | Yang |
| 8,219,780 B2 | 7/2012 | Callister et al. |
| 8,327,161 B2 | 12/2012 | Cohen |
| 8,365,114 B2 | 1/2013 | Arbel et al. |
| 8,417,448 B1 | 4/2013 | Denise |
| 8,635,412 B1 | 1/2014 | Wilshire |
| 8,683,149 B2 | 3/2014 | Ware et al. |
| 8,687,423 B2 | 4/2014 | Yoo |
| 8,762,800 B1 | 6/2014 | Weingarten |
| 8,811,110 B2 | 8/2014 | Schaefer et al. |
| 8,843,731 B2 | 9/2014 | Bueb et al. |
| 9,116,620 B2 | 8/2015 | Lassa et al. |
| 9,208,261 B2 | 12/2015 | Shah et al. |
| 9,583,220 B2 | 2/2017 | Tsai et al. |
| 9,600,191 B2 | 3/2017 | Pawlowski |
| 9,858,242 B2 | 1/2018 | Palmer et al. |
| 2009/0083476 A1 | 3/2009 | Pua et al. |
| 2010/0122097 A1 | 5/2010 | Cohen |
| 2012/0020155 A1 | 1/2012 | Kim |
| 2012/0210056 A1 | 8/2012 | Okabe et al. |
| 2018/0039535 A1 | 2/2018 | Tehrani et al. |
| 2019/0018597 A1* | 1/2019 | Zhang ................. G06F 3/0611 |
| 2019/0179532 A1 | 6/2019 | Tseng et al. |
| 2019/0179568 A1 | 6/2019 | Hsu et al. |
| 2019/0179573 A1 | 6/2019 | Hsu et al. |
| 2019/0180824 A1 | 6/2019 | Hsu |
| 2019/0235762 A1* | 8/2019 | Kaburaki ............. G06F 3/0679 |
| 2020/0051629 A1 | 2/2020 | Baek et al. |

OTHER PUBLICATIONS

Preliminary Amendment dated Jun. 19, 2020, U.S. Appl. No. 16/906,233, filed Jun. 19, 2020.
Intel, "Max 10 User Flash Memory User Guide," UG-M10UFM, Feb. 21, 2017, 29 pages.
Intel, "AN 741: Remote System Upgrade for Max 10 FPGA Devices over UART with the Nios II Processor," AN-741, Feb. 21, 2017, 15 pages.
Gupta, Megha et al., "Design and Implementation of Content Addressable Memory (CAM) Architecture," International Journal of Science and Research, vol. 4, Issue 10, Oct. 2015, 4 pages.
Wentzlahf, David, "ELE 475 / COS 475, Computer Architecture, Lecture 10: Advanced Caches," Powerpoint, Dept. of Electrical Engineering, Princeton University, Apr. 2012, 68 pages.
Fox, et al., "Co-processing SPMD Computation on GPUs and CPUs on Shared Memory System," School of Informatics and Computing, Pervasive Technology Institute, Indiana University Bloomington, Apr. 2013.
Altera Corporation, Embedded Design Handbook, Chapter 8: Hardware Acceleration and Coprocessing, ED51006-1.2, Jul. 2011.
Altera Corporation, SOPC Builder User Guide, Dec. 2010.
U.S. Appl. No. 16/443,705, filed Jun. 20, 2019.
U.S. Appl. No. 16/453,012, filed Jun. 26, 2019.
First Action Interview Pilot Program Pre-Interview Communication dated May 16, 2022, U.S. Appl. No. 16/906,233, filed Jun. 19, 2020.
First Action Interview Office Action dated Jul. 18, 2022, U.S. Appl. No. 16/906,233, filed Jun. 19, 2020.

\* cited by examiner

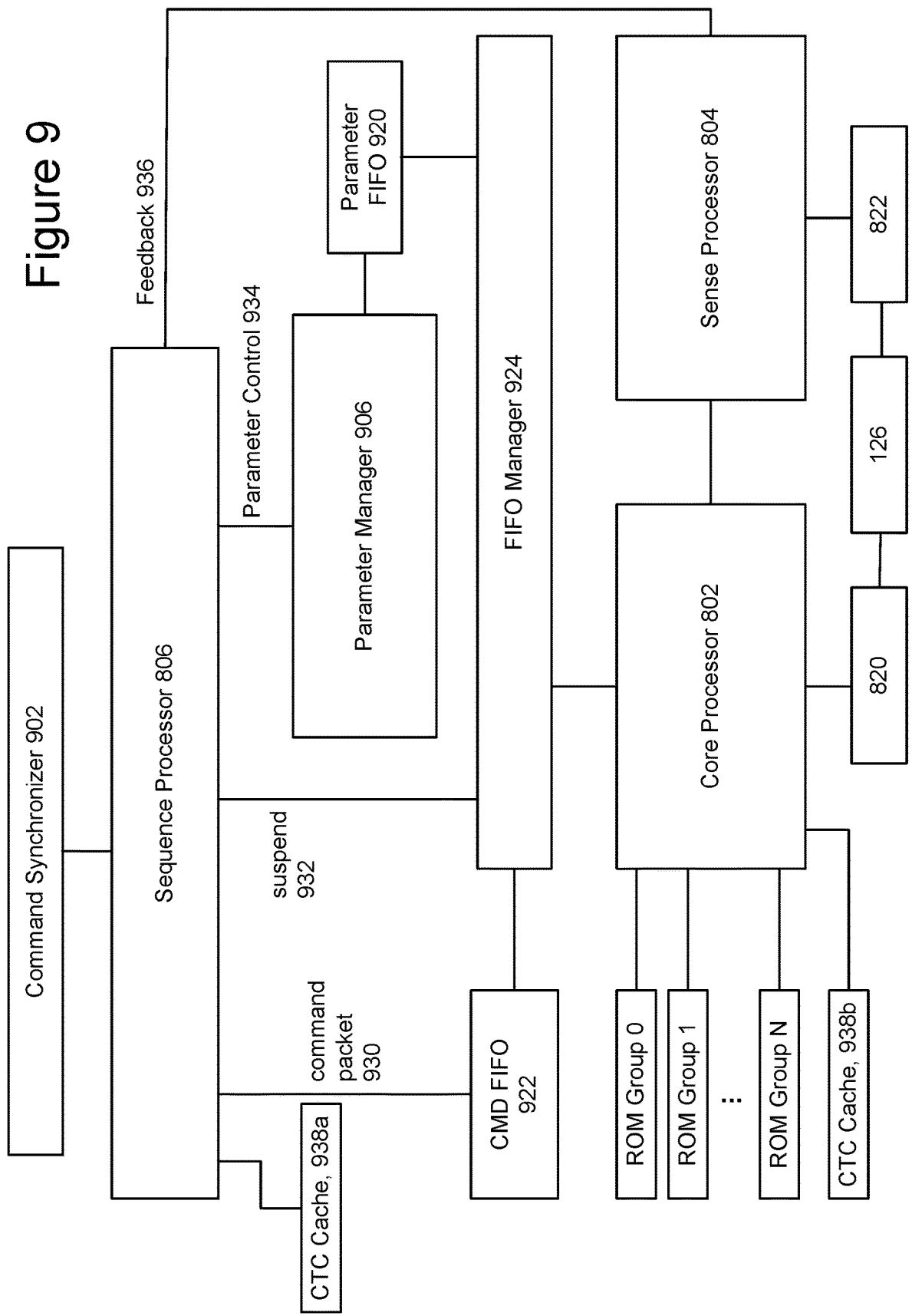

| CTC Signal | Mode | Sub-Mode | Main_CLk | Sub_clock | Condition | Set/Reset |
|---|---|---|---|---|---|---|
| CTC Signal 1 | Progam | ABL Program | P_CLK | p1 | A OR B | SET |
| CTC Signal 1 | Progam | ABL Program | P_CLK | p9 | C | RESET |
| CTC Signal 2 | Progam | SLC Program | P_CLK | p4 | NOT D | SET |
| CTC Signal 2 | Progam | SLC Program | P_CLK | p6 | E AND F | RESET |
| CTC Signal 2 | Progam | MLC Program | P_CLK | p5 | NOT D | SET |
| CTC Signal 2 | Progam | MLC Program | P_CLK | p7 | E AND F | RESET |
| CTC Signal 3 | Progam | MLC Program | P_CLK | p4 | NOT G | SET |
| CTC Signal 3 | Progam | MLC Program | P_CLK | p7 | G AND H | RESET |
| CTC Signal 1 | Read | SLC Read | R_CLK | r1 | I AND J | SET |
| CTC Signal 1 | Read | SLC Read | R_CLK | r4 | I AND K | RESET |
| CTC Signal 2 | Read | MLC Read | R_CLK | r1 | I AND J | SET |
| CTC Signal 2 | Read | MLC Read | R_CLK | r5 | I AND K | RESET |
| CTC Signal 4 | Read | SLC Read | R_CLK | r2 | I AND J AND L | SET |
| CTC Signal 4 | Read | SLC Read | R_CLK | r4 | I AND K AND L | RESET |
| CTC Signal 5 | Read | MLC Read | R_CLK | r3 | M and NOT P | SET |
| CTC Signal 5 | Read | MLC Read | R_CLK | r6 | NOT P OR Q | RESET |

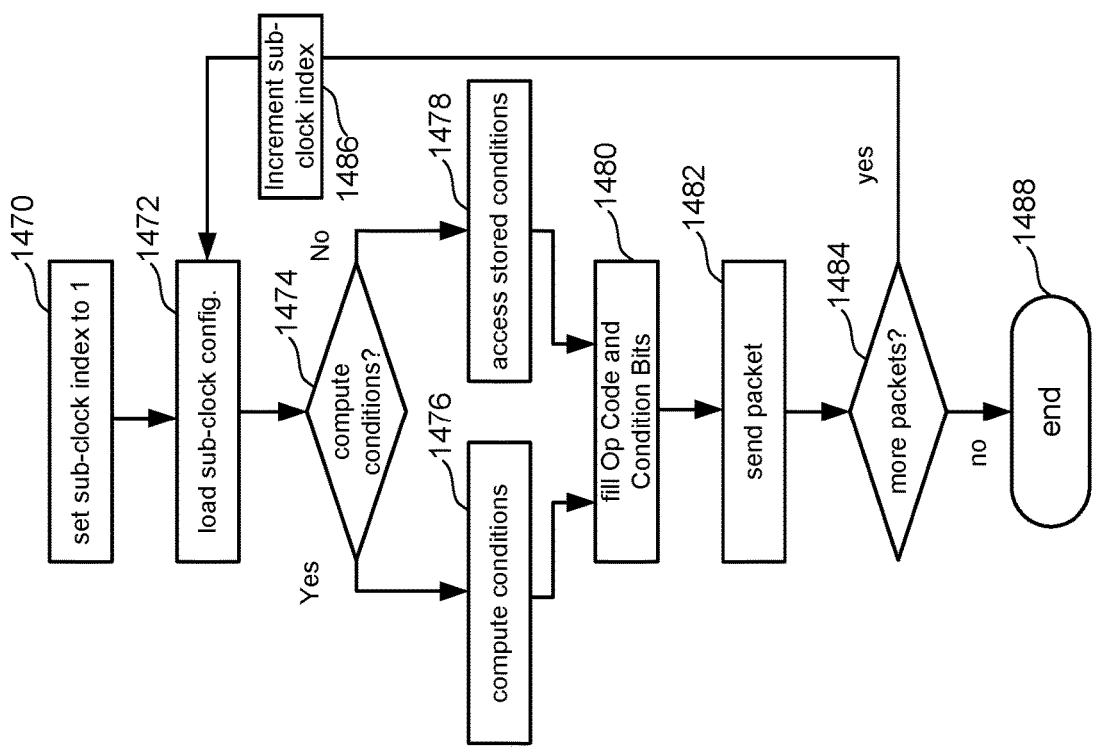
Figure 14C
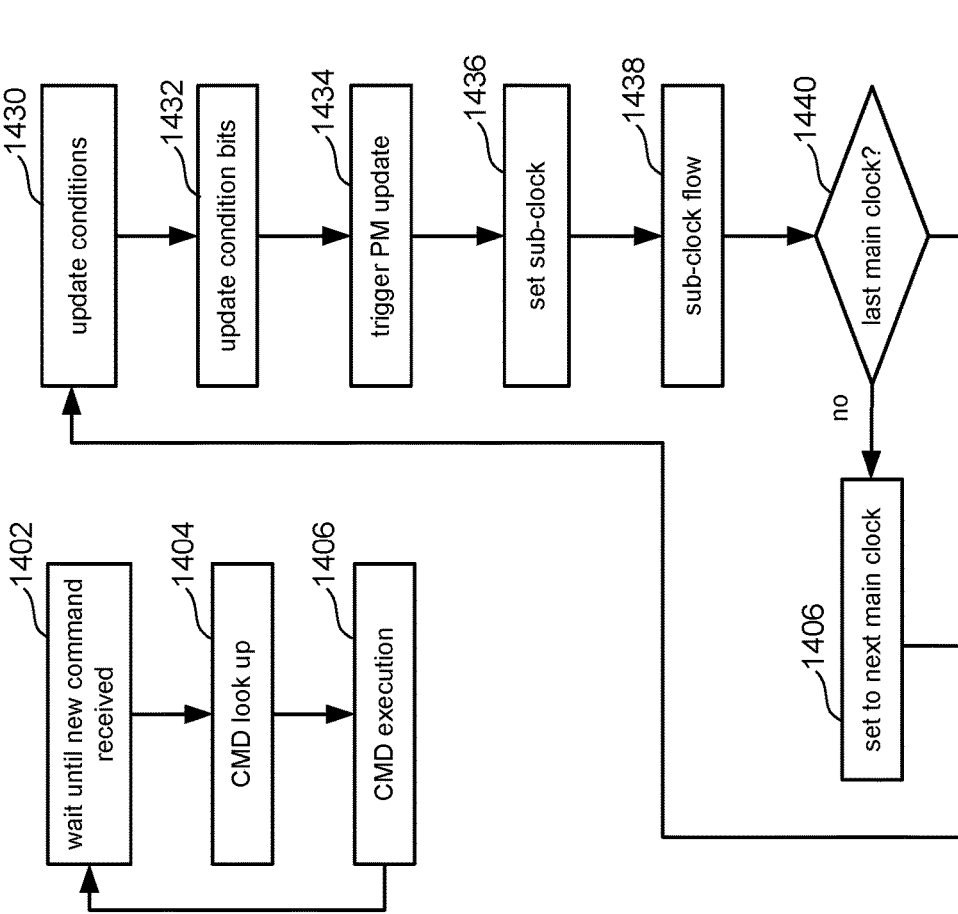
Figure 14B
Figure 14A

PRE-COMPUTATION OF MEMORY CORE CONTROL SIGNALS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 9 is a block diagram of one embodiment of a microcontroller configured to issue core timing control (CTC) signals.

FIG. 10B depicts one embodiment of master table pertaining to CTC signals.

FIG. 14A is a flowchart of one embodiment of a command level flow for the Sequence Processor.

FIG. 14B is a flowchart of one embodiment of a process of executing a command on Sequence Processor.

FIG. 14C is a flowchart of one embodiment of a sub-clock flow performed by Sequence Processor.

DETAILED DESCRIPTION

Figure 1:
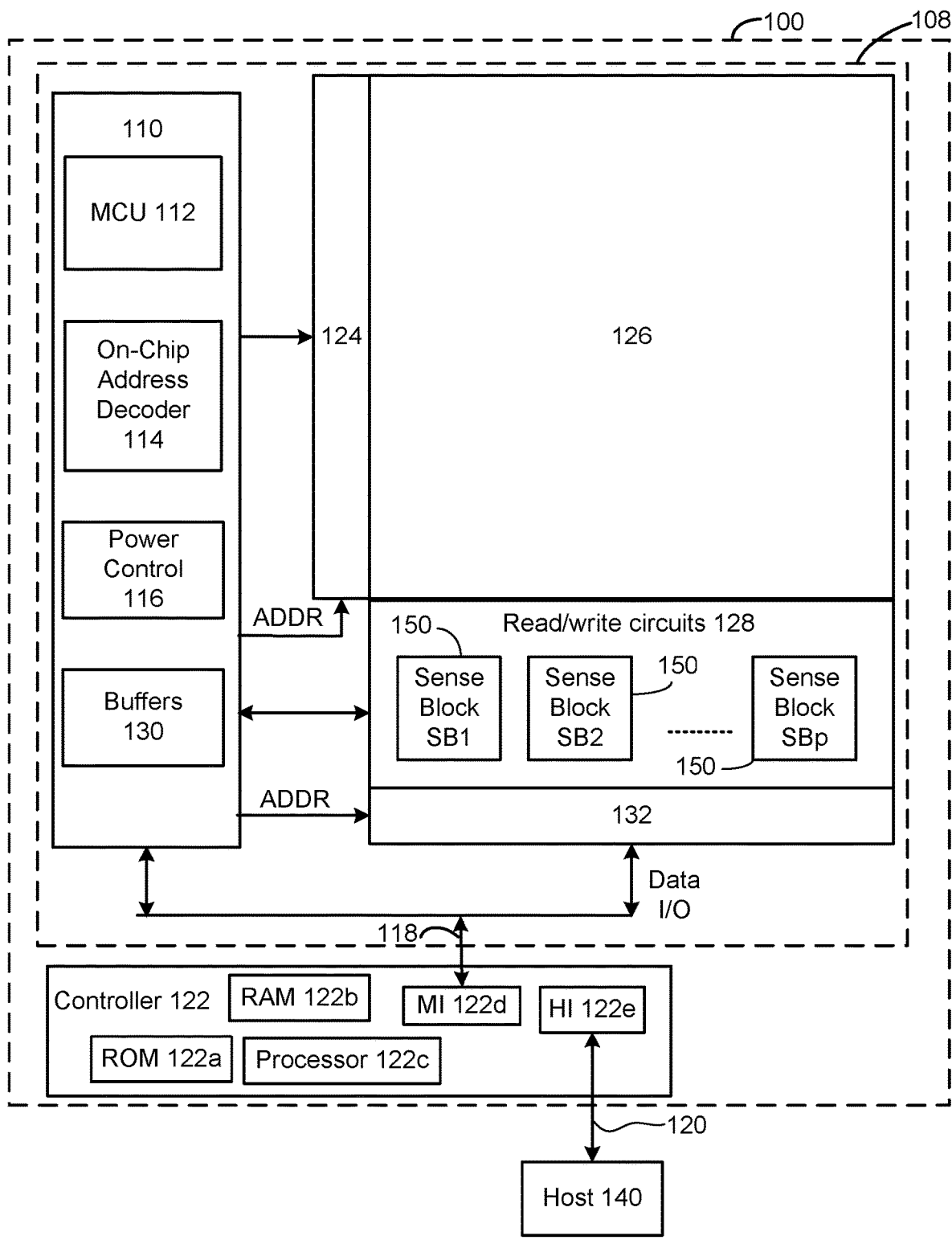
FIG. 1 is a functional block diagram of a memory device.

A proposed non-volatile memory system includes a memory structure and a control circuit connected to the memory structure. The memory structure includes non-volatile memory cells. The control circuit may include a programmable and reprogrammable microcontroller (e.g., MCU), in an embodiment. In one embodiment, the microcontroller is configured to output Core Timing Control (CTC) signals. The CTC signals are used to control voltages that are applied in the memory structure to control memory operations such as program, read, and erase. The CTC signals may also be referred to as memory core control signals. In one embodiment, the MCU sets or resets CTC signals during a memory operation in order to control the voltages. For example, the CTC signals may be used to control the timing of voltages applied to word lines, bit lines, select lines, and other elements or control lines in the memory structure. The MCU is used in a bit-cost-scalable (BiCs) architecture, in some embodiments.

A memory operation may contain multiple segments, which are referred to herein as sub-clocks. In some embodiments, a CTC signal may either be set or reset during a sub-clock. When a CTC signal is set, a corresponding voltage that is applied to the memory structure may increase from, for example, low to high. In some embodiments, the MCU determines the low and high voltages. When a CTC signal is reset, the corresponding voltage may decrease from high to low.

Computing the CTC signals using a processor in the MCU may require numerous processor clock cycles. For example, computing the CTC signals could include a first step of computing conditions that may be based on a combination of modes (or sub-modes), parameters, and/or state dependent bits. An example of a mode is a read, write or erase command. Examples of sub-modes for a read command include a multi-bit per cell read (MLC read) and a single-bit per cell read (SLC read). The parameters may be used to specify various options that can be applied during a memory command. A state dependent bit may define how the flow of the CTC signals is to proceed. For example, a state dependent bit could indicate that a wait state is needed at a certain point. In one embodiment, a condition is a combinational logic clause with inputs from modes, sub-modes, parameters, and/or state dependent bits. The condition is not limited to these inputs. In some embodiments, the conditions are determined for each sub-clock of a memory operation.

Determining the CTC signals may include a second step of determining the CTC signals based on the conditions. For some memory operations (or segments thereof), it may be acceptable to take numerous processor clock cycles to compute the CTC signals. However, for other memory operations (or segments thereof) it may be desirable to have a faster way to generate the CTC signals. One possible solution to generate the aforementioned conditions, as well as the CTC signals, is to use combinational logic. Combinational logic can be faster than a processor. However, combinational logic is not as flexible as a processor. For example, changing the combinational logic may be achieved by modifying metal layers in silicon. Embodiments that have programmable and reprogrammable MCU to generate the CTC signals provide flexibility in that changes can be made to the CTC signals using updates to instructions and/or parameters used by the processor.

In one embodiment, information from which the CTC signals may be directly generated is pre-computed and stored. For example, set/reset information that specifies when voltages to be applied to the non-volatile memory structure are to be set or reset may be pre-computed and stored. This pre-computation may be performed in a power on phase of the memory system, but may also be performed after power on. When a request to perform a memory operation of that type is received, the stored set/reset information may be accessed and used to generate the CTC signals to control the memory operation. Thus, considerable time is saved. Note that this time savings occurs each time a memory operation of the type is performed. Also, power is saved due to not having to repeatedly perform the computation. Moreover, because the set/reset information is computed, it is possible to modify the CTC signals by altering parameters or instructions used to perform the computation.

Storing the set/reset information may require a significant amount of storage. In one embodiment, rather than pre-computing the set/reset information, various conditions discussed above are pre-computed and stored. When a request to perform a memory operation of is received, the stored conditions may be accessed and used to generate the CTC signals. Thus, considerable time is saved by not having to determine the conditions at run time (when a request to perform the memory operation is received). Note that this time savings occurs each time a memory operation is performed. Also, power is saved due to not having to repeatedly perform the computation. Moreover, because the conditions are computed, it is possible to modify the conditions and hence the CTC signals by altering parameters or instructions used to perform the computation.

As noted above, a memory operation may contain multiple segments, which are referred to herein as sub-clocks. In some embodiments, the pre-computation is performed for a particular sub-clock of a memory operation. A reason for this is that there may be a limited amount of time prior to the sub-clock in order to perform the computation. If the computation were to be performed at run time, the computation could result in a need to add an unnecessary delay to a memory operation in order to generate the CTC signals for a sub-clock.

Figure 2:
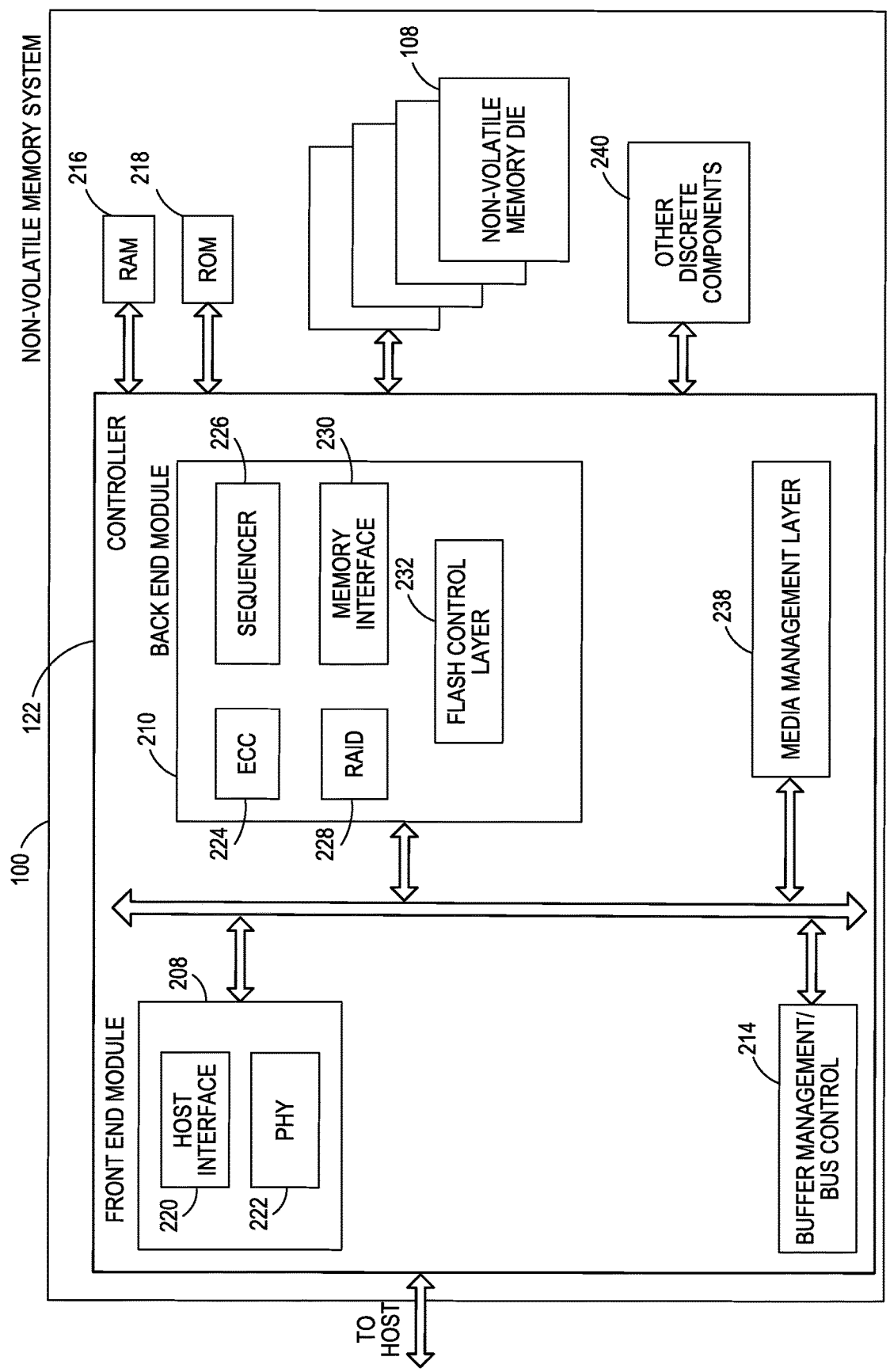
FIG. 2 is a block diagram depicting one embodiment of a memory system.
Figure 3:
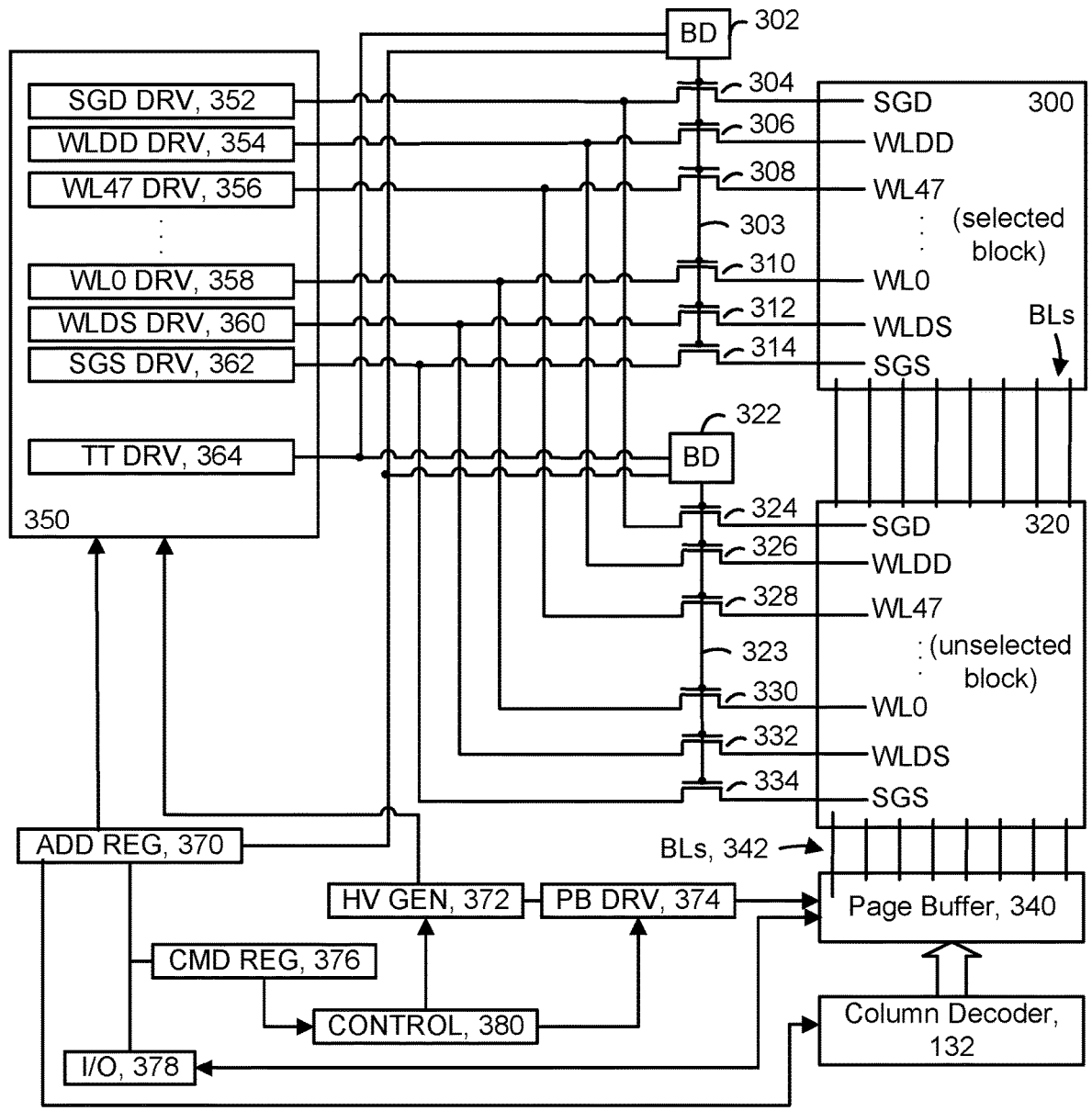
FIG. 3 depicts an embodiment of circuits for applying voltages to a memory structure.

FIGS. 1-3 describe one set of examples of a memory system that can be used to implement the technology described herein. FIG. 1 is a functional block diagram of an example memory system 100. The components depicted in FIG. 1 are electrical circuits. Memory system 100 includes one or more memory die 108. The one or more memory die 108 can be complete memory die or partial memory die.

In one embodiment, each memory die 108 includes a memory structure 126, control circuitry 110, and read/write circuits 128. Memory structure 126 is addressable by word lines via a row decoder 124 and by bit lines via a column decoder 132. Read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, controller 122 can be separated from memory die 108. In some embodiments controller 122 will be on a different die than the memory die 108. In some embodiments, a single controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes a programmable and reprogrammable microcontroller (MCU) 112, an on-chip address decoder 114, and a power control circuit 116. Microcontroller 112 provides die-level control of memory operations. In an embodiment, microcontroller 112 is programmable by software. In other embodiments, microcontroller 112 does not use software and is completely implemented in hardware (e.g., electrical circuits).

In an embodiment, control circuitry 110 includes buffers 130 such as registers, ROM fuses and other storage devices for storing default values such as base voltages and other parameters. In one embodiment, the default values are stored in memory structure 126. In one embodiment, the default values are loaded from memory structure into buffers 126 during a power on phase. In one embodiment, the MCU 112 accesses the default values during the power on phase, and pre-computes information for generating CTC signals for a type of memory operation. For example, the type of memory operation could be an MLC read or an SLC read. However, the type of memory operation is not limited to a read operation. The MCU 112 stores the pre-computed information in, for example, latches in the MCU 112. Thus, the MCU 112 need not compute the information each time that the type of memory operation is executed.

On-chip address decoder 114 provides an address interface between addresses used by host 140 or controller 122 to the hardware address used by row decoder 124 and column decoder 132. Power control circuit 116 controls the power and voltages supplied to the word lines and bit lines during memory operations. Power control circuit 116 may include charge pumps for creating voltages. Sense blocks 150 include bit line drivers.

Microcontroller 112 and/or controller 122 (or equivalently functioned circuits), in combination with all or a subset of the other circuits depicted in FIG. 1, can be considered to be one or more control circuits that performs the functions described herein. The one or more control circuits can include hardware only or a combination of hardware and software (including firmware). For example, a controller programmed by firmware to perform the functions described herein is one example of a control circuit. The one or more control circuits can include a processor, Field Programmable Gate Array (FPGA), Application Specific Integrated Circuit (ASIC), integrated circuit or other type of circuit.

In an embodiment, control circuitry 110 (including microcontroller 112), read/write circuits 128, decoders 124 and decoders 132 are positioned on the substrate and underneath memory structure 126, which may be referred to as a "circuit under array."

Controller 122 (which in one embodiment is an electrical circuit) may include one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in memory structure 126, such as a reserved area of memory cells connected to one or more word lines. RAM 122*b* can be to store data for controller 122, including caching program data (discussed below).

Memory interface 122*d*, in communication with ROM 122*a*, RAM 122*b* and processor 122*c*, is an electrical circuit that provides an electrical interface between controller 122 and one or more memory die 108. For example, memory interface 122*d* can change the format or timing of signals, provide a buffer, isolate from surges, latch I/O, etc. One or more processors 122*c* can issue commands to control circuitry 110 (or another component of memory die 108) via Memory Interface 122*d*. Host interface 122*e* provides an electrical interface with host 140 via data bus 120 to receive commands, addresses and/or data from host 140 to provide data and/or status to host 140.

In one embodiment, memory structure 126 includes a three-dimensional (3D) memory array of non-volatile memory cells in which multiple memory levels are formed above a substrate, such as a wafer. Memory structure 126 (which may be referred to as a "non-volatile memory structure") may include any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 includes a two-dimensional (2D) memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1A:
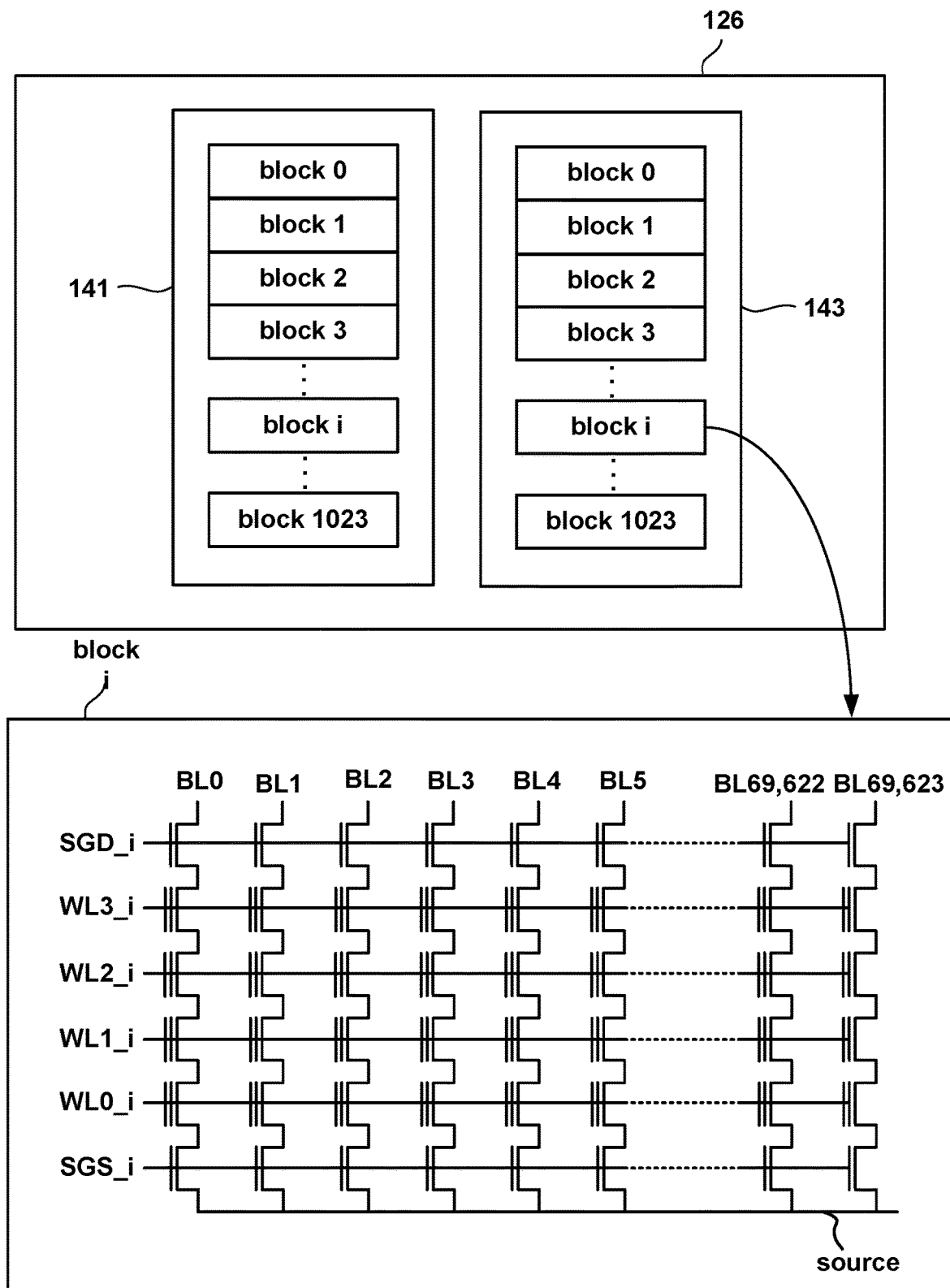
FIG. 1A is a block diagram depicting one example of a memory structure.

FIG. 1A depicts an example of memory structure 126. In one embodiment, an array of memory cells is divided into multiple planes. In the example of FIG. 1A, memory structure 126 is divided into two planes: plane 141 and plane 143. In other embodiments, more or less than two planes can be used. In some embodiments, each plane is divided into a number of memory erase blocks (e.g., blocks 0-823, or another amount).

In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase also can be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines. For example, erase block i of FIG. 1A includes memory cells that share word lines WL0_*i*, WL1_*i*, WL2_*i* and WL3_*i* and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1A shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1A shows 69624 bit lines, a different number of bit lines also can be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data are being written into the array, and also checks the ECC when data are being read from the array. In one embodiment, a page includes data stored in all memory cells connected to a common word line.

In the example discussed above, the unit of erase is a memory erase block and the unit of programming and reading is a page. Other units of operation also can be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

Figure 1B:
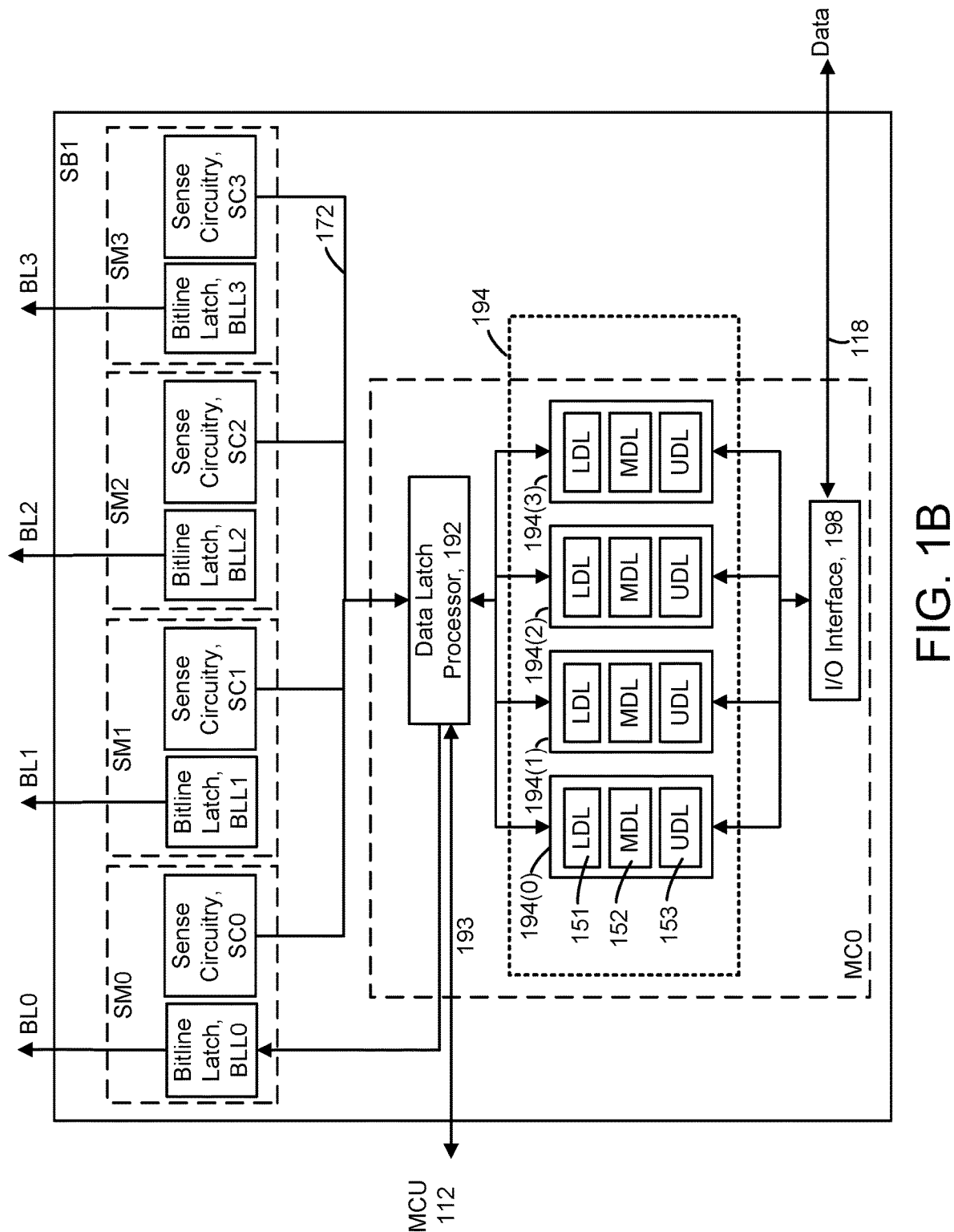
FIG. 1B is a block diagram depicting one embodiment of the sense block SB1 of FIG. 1A.

FIG. 1B is a block diagram depicting one embodiment of the sense block SB1 of FIG. 1. Sense block SB1 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 includes sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 includes a data latch processor 192, four example sets of data latches 194(0), 194(1), 194(2) and 194(3) and an I/O interface 198 coupled between the sets of data latches 194 and lines 118. In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3.

Each set of data latches includes data latches identified by LDL 151, MDL 152, and UDL153, in this embodiment. LDL 151 stores a bit for a lower page of write data, MDL 152 stores a bit for a middle page of write data, and UDL 153 stores a bit for an upper page of write data, in a memory which stores three bits of data in each memory cell. Note that there may be one set of such latches associated with each bit line. The latches 194 also may be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its threshold voltage is within a specified margin of the verify voltage of its target data state.

Data latch processor 192 performs computations during reading and programming. For reading, data latch processor 192 determines the data state stored in the sensed memory cell and stores the data in the set of data latches. For full programming and refresh programming, data latch processor 192 reads the latches to determine the data state which is to be written to a memory cell.

During reading, the operation of the system is under the control of microcontroller 112 which controls the supply of different control gate voltages to the addressed memory cell. As it steps through the various predefined control gate voltages corresponding to the various memory states supported by the memory, the sense module may trip at one of these voltages and a corresponding output will be provided from the sense module to data latch processor 192 via data bus 172. At that point, data latch processor 192 determines the memory state by considering the tripping event(s) of the sense module and the information about the applied control gate voltage from microcontroller 112 via input lines 193.

Data latch processor 192 then computes a binary encoding for the memory state and stores the resultant data bits into the data latches 194. For example, the memory state for a memory cell associated with bit line BL0 may be stored in latches 194(0), etc. Herein, a "memory state" may also be referred to as a "data state." In another embodiment of the managing circuit MC0, the bit line latch serves both as a latch for latching the output of the sense module and also as a bit line latch as described above.

In an embodiment, MCU 112 executes instructions to control data latch processor 192 to test conditions of non-volatile memory cells in response to voltages applied to memory structure 126 (such as reference voltages applied to the non-volatile memory cells). The condition of a non-volatile memory cell can be any physical parameter of a non-volatile memory cell. Example conditions include, but are not limited to, a data state (e.g., S0-S7 in FIG. 4), a conduction current, a resistance, and a transistor threshold voltage. The manner in which the condition may be tested may include, but is not limited to, sensing, reading, detecting, measuring, probing, discovering, discriminating, checking, examining, and determining.

In an embodiment, MCU 112 executes instructions to control data latch processor 192 to determine a data state (e.g., S0-S7 in FIG. 4) of memory cells. The data state may be defined by a range of some physical parameter including, but not limited to, transistor threshold voltage, resistance, or current. Thus, to determine a data state means to determine what range of a certain physical parameter a memory cell is in.

In an embodiment, MCU 112 executes instructions to control data latch processor 192 to determine whether a memory cell conducts a current in response to voltages applied to the memory cell. In an embodiment, MCU 112 executes instructions to control data latch processor 192 to determine whether the threshold voltage of a memory cell is above or below a reference voltage (e.g., Vr1-Vr7; or Vv1-Vv7 in FIG. 4) applied to the memory cell.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because microcontroller 112 receiving the wired-OR can determine when all bits being programmed have reached the desired level.

For example, when each bit has reached its desired level, a logic zero for that bit will be sent to the wired-OR line (or a data one is inverted). When all bits output a data 0 (or a data one inverted), then microcontroller 112 knows to terminate the programming process. Because each processor communicates with four sense modules, microcontroller 112 needs to read the wired-OR line four times, or logic is added to data latch processor 192 to accumulate the results of the associated bit lines such that microcontroller 112 need only read the wired-OR line one time. Similarly, by choosing the logic levels correctly, microcontroller 112 can detect when the first bit changes its state and change the algorithms accordingly.

During program or verify operations, the data to be programmed (write data) are stored in data latches 194 from lines 118, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of microcontroller 112, comprises a series of programming voltage pulses applied to the control gates of the addressed memory cells. Each programming voltage is followed by a read back (verify test) to determine if the memory cell has been programmed to the desired memory state.

In some cases, data latch processor 192 monitors the read back memory state relative to the desired memory state. When the two states agree, data latch processor 192 sets the bit line latch to cause the bit line to be pulled to a state designating program inhibit (e.g., 2-3V). This inhibits the memory cell coupled to the bit line from further programming even if programming voltages appear on its control gate. In other embodiments, data latch processor 192 initially loads the bit line latch, and the sense circuitry sets the bit line latch to an inhibit value during the verify process.

Each set of data latches 194 may be implemented as a stack of data latches for each sense module. In some implementations, the data latches are implemented as a shift register so that the parallel data stored therein is converted to serial data for lines 118, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 122. In an embodiment, controller 122 is a flash memory controller. Non-volatile memory 108 is not limited to flash memory technology. Thus, controller 122 is not limited to the example of a flash memory controller. As used herein, a flash memory controller is a device that manages data stored in flash memory and communicates with a host, such as a computer or electronic device. A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when a host needs to read data from or write data to the flash memory, the host will communicate with the flash memory controller. If the host provides a logical address to which data are to be read/written, the flash memory controller can convert the logical address received from the host to a physical address in the flash memory. (Alternatively, the host can provide the physical address). The flash memory controller also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an ASIC, an FPGA, a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e., RAM, ROM, processor, interface).

Referring again to modules of controller 122, a buffer management/bus control 214 manages buffers in random access memory (RAM) 216 and controls the internal bus arbitration of controller 122. A read only memory (ROM) 218 stores system boot code. Although illustrated in FIG. 2 as located separately from controller 122, in other embodiments one or both of the RAM 216 and ROM 218 may be located within controller 122. In yet other embodiments, portions of RAM and ROM may be located both within controller 122 and outside controller 122. Further, in some implementations, controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. Host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one more extra die as implied by the common name, but RAID parity also may be added within the existing die, e.g., as an extra plane, or extra block, or extra WLs within a block.

A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of physical layer interface 222, RAID module 228, media management layer 238 and buffer management/bus controller 214 are optional components that are not necessary in controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, MML 238 may include an algorithm in the memory device firmware which translates writes from the host into writes to memory structure 126 of die 108. MML 238 may be needed because memory structure 126: 1) may have limited endurance; 2) may only be written in multiples of pages; and/or 3) may not be written unless it is erased as a block.

MML 238 understands these potential limitations of memory structure 126 which may not be visible to the host. Accordingly, MML 238 attempts to translate writes from host into writes into memory structure 126. As described below, erratic bits may be identified and recorded using MML 238. This recording of erratic bits can be used for evaluating the health of blocks and/or word lines (the memory cells on the word lines).

Controller 122 may interface with one or more memory die 108. In one embodiment, controller 122 and multiple memory die (together comprising non-volatile storage system 100) implement an SSD, which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a diagram that shows further details of one embodiment of circuits for applying voltages to a memory structure 126. Two blocks 300, 320 of memory cells are depicted. Circuits of FIG. 3 apply voltages to word lines and select lines. Microcontroller 112 provides control signals to the circuits, in one embodiment. For example, microcontroller 112 may issue control signals to one or more of CONTROL 380, High Voltage Generator (HV GEN) 372, Page Buffer Driver (PB DRV) 374, Command Register (CMD REG) 376 and Input/Output (I/O) Buffer 378. In an embodiment, microcontroller 112 issues control signals to CONTROL 380, which in turn controls other elements such as HV GEN 372 and PB DRV 374.

In an embodiment, HV GEN 372 is connected to word line driver 350, to control magnitudes and timing of voltages. PB DRV 374 is connected to page buffer 340 to control the page buffer 340. The page buffer 340 may include sense blocks, such as SB1 of FIG. 1B.

Each block of storage elements is associated with a set of transfer transistors, in one possible embodiment. For example, block 300, which is a selected block in this example, e.g., a block in which a programming or sense operation is to take place, includes a drain-side select gate (SGD) connected to a transfer transistor 304, a drain-side dummy word line (WLDD) connected to a transfer transistor 306, a word line (WL47) connected to a transfer transistor 308, intermediate word lines WL30-WL1 (not shown) connected to respective transfer transistors (not shown), a word line (WL0) connected to a transfer transistor 310, a source-side dummy word line (WLDS) connected to a transfer transistor 312, and a source-side select gate (SGS) connected to a transfer transistor 314.

The control gate of each transfer transistor of block 300 is connected to a block decoder (BD) 302 via a common path 303. The BD 302 receives a voltage from a transfer transistor driver (TT DRV) 364 and a control signal from an address register (ADD REG) 370. The control signal includes an address. If the address matches an address of the BD 302, BD 302 acts as a conductive switch which passes the voltage to the control gates of the associated transfer transistors via path 303. If the address does not match the address of BD 302, BD 302 acts as a non-conductive switch which does not pass the voltage to the control gates of the associated transfer transistors.

Each transfer transistor may be an n-channel MOSFET, for example, which has a drain node on the left hand side and a source node on the right hand side. The drain node for each transfer transistor is connected to a respective voltage driver in a set of high-voltage voltage drivers 350. Each driver may include an on-chip charge pump.

For example, the transfer transistor 304 is connected to a drain select gate driver (SGD DRV) 352, the transfer transistor 306 is connected to a dummy word line driver (WLDD DRV) 354, the transfer transistor 308 is connected to the word line driver (WL47 DRV) 356, . . . , the transfer transistor 310 is connected to the word line driver (WL0 DRV) 358, the transfer transistor 312 is connected to the source side dummy word line driver (WLDS DRV) 360, and the transfer transistor 314 is connected to the source select gate driver (SGS DRV). Each voltage driver can be independently controlled to provide a desired output voltage.

A similar arrangement is used for the example unselected block 320, which includes a transfer transistor 324 connected to SGD and SGD DRV 352, a transfer transistor 326 connected to WLDD and WLDD DRV 354, a transfer transistor 328 connected to WL47 and WL47 DRV 356, . . . , a transfer transistor 330 connected to WL0 and WL0 DRV 358, a transfer transistor 332 connected to WLDS and WLDS DRV 360, and a transfer transistor 334 connected to SGS and SGS DRV 362.

The control gates of the transfer transistors of unselected block 320 are connected to a respective block decoder (BD) 322 via a common path 323. BD 322 also is connected to TT DRV 364 to receive a voltage, and to address register 370 to receive a control signal which instructs BD 322 to pass or not pass the voltage to the control gates of the associated transfer transistors via path 323. Address register (ADD REG) 370 also communicates with the voltage drivers in the set of high-voltage voltage drivers 350.

A number of bit lines (BLs) 342 extend across the selected block 300 and the unselected block 320 (and across additional unselected blocks, not shown, in some implementations) and into a page buffer 340, which is responsive to column decoder 132. Page buffer 340 stores data which are written into, or read from, a selected word line of the selected block.

During an operation of the memory device, address register 370 provides a data load command to an input-output buffer 378 and to a command register 376. Input-output buffer 378 provides the command to page buffer 340. Command register 376 provides a command to a control circuit 380, which instructs a high voltage generator 372 to control voltage drivers 350 at appropriate levels.

Typically, during programming, the driver of the selected word line provides a programming level voltage, such as 12-26 V and the unselected word lines receive a pass voltage VPASS such as 4-6 V. During sensing, the driver of the selected word line provides a read or verify level voltage ($V_{CGR}$ or $V_{VERIFY}$, respectively), while the unselected word lines receive a read pass voltage, $V_{READ\text{-}PASS}$. Control 380 also instructs the page buffer driver (PB DRV) 374 to control page buffer 340. Address register 370 also communicates with column decoder 132.

Figure 4:
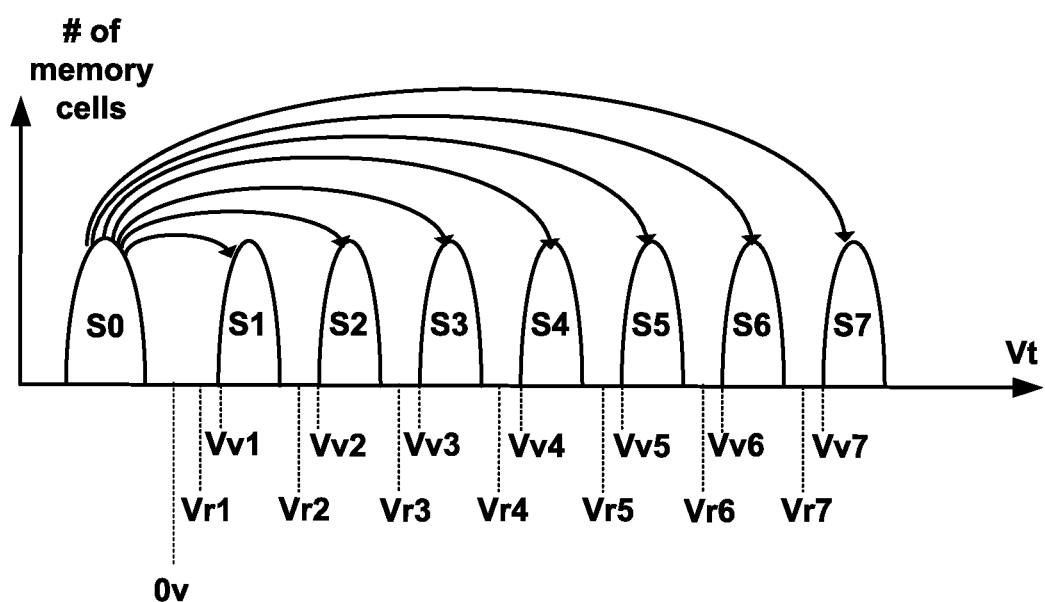
FIG. 4 depicts threshold voltage distributions.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell).

FIG. 4 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, also are called programmed states. Each threshold voltage distribution (data state) corresponds to predetermined values for the set of data bits.

The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (e.g., S0, S1, S2, S3, . . . ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7.

For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

In one embodiment, when a block is subjected to an erase operation, all memory cells are moved to data state S0, the erased state. The proposed technology described herein can be used for embodiments in which each memory cell stores one bit of data per memory cell (also referred to as SLC) and for embodiments in which each memory cell stores multiple bits of data per memory cell (FIG. 4). When memory cells store one bit of data per memory cell, there may be two data states. When memory cells store two bits of data per memory cell, there may be four data states.

Figure 5:
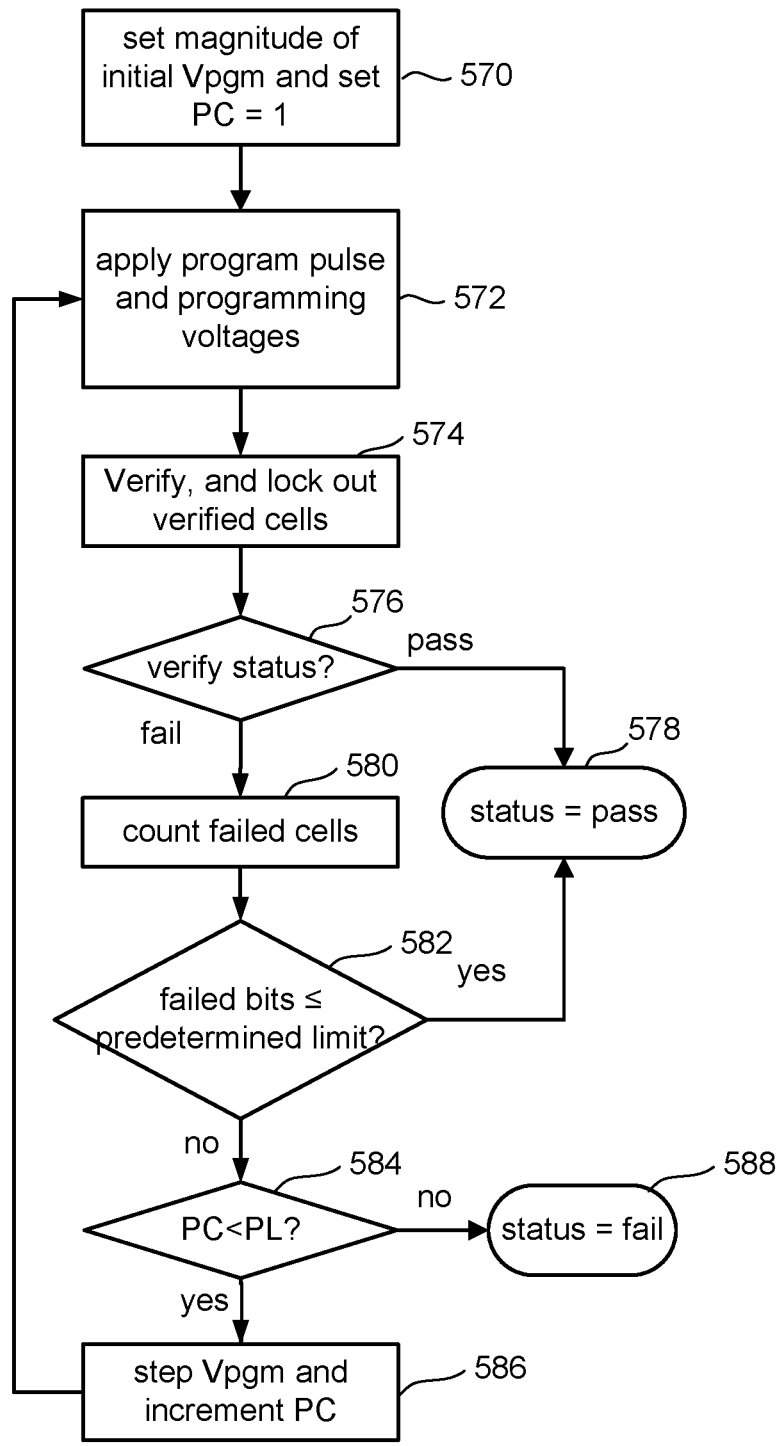
FIG. 5 is a flow chart describing one embodiment of a process for programming/writing data into memory cells connected to a common word line.

FIG. 5 is a flowchart describing one embodiment of a process for programming. In one example embodiment, the process of FIG. 5 is performed on memory die 108 using the one or more control circuits discussed above (see FIG. 1), at the direction of microcontroller 112. The process of FIG. 5 also can be used to implement the full sequence programming discussed above. The process of FIG. 5 also can be used to implement each phase of a multi-phase programming process. Additionally, the process of FIG. 5 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 570 of FIG. 5, the programming voltage (Vpgm) is initialized to the starting magnitude (e.g., ~12-16V or another suitable level) and a program counter PC maintained by microcontroller 112 is initialized at 1.

In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming.

In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target data states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by microcontroller 112, controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 588. This is one example of a program fault.

If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 586, the process loops back to step 572 and another program pulse is applied to the selected word line so that another iteration (steps 572-586) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g., see verify reference voltages Vv1, Vv2, Vv3, Vv4, Vv5, Vv6, and Vv7 of FIG. 4) to determine whether a threshold voltage of the concerned memory cell has reached such level. After applying the word line voltage, the conduction current of the memory cell is measured to determine whether the memory cell turned on (conducted current) in response to the voltage applied to the word line.

If the conduction current is measured to be greater than a certain value, then it is assumed that the memory cell turned ON and the voltage applied to the word line is greater than the threshold voltage of the memory cell. If the conduction current is not measured to be greater than the certain value, then it is assumed that the memory cell did not turn ON and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Step 572 of FIG. 5 includes applying a program voltage pulse on the selected word line. Step 574 of FIG. 5 includes verification, which in some embodiments comprises applying the verify reference voltages on the selected word line. As steps 572 and 574 are part of an iterative loop, the program voltage is applied as a series of voltage pulses that step up in magnitude. Between voltage pulses, verify reference voltages are applied.

Figure 6:
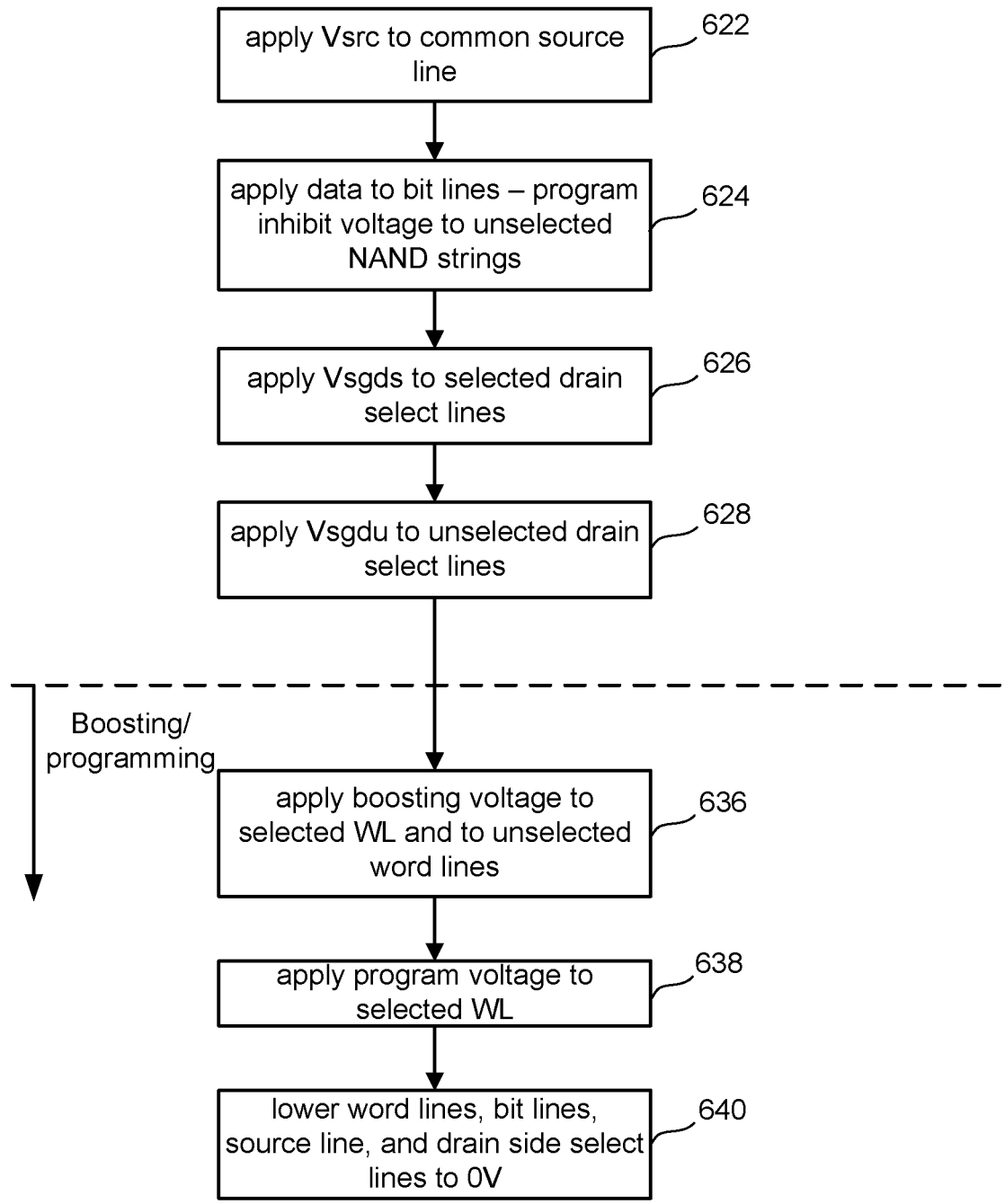
FIG. 6 is a flowchart of one embodiment details of programming non-volatile storage during step 572 of FIG. 5.

FIG. 6 is a flowchart of one embodiment of applying a program pulse and programming voltages that may be used in step 572 of FIG. 5. This process is used to program 3D NAND in one embodiment. FIG. 6 shows timing of various signals during one embodiment of the process of FIG. 6. The MCU 112 controls the timing and magnitudes of the signals in FIG. 6, in one embodiment. Note that the various signals in FIG. 6 are just one example of voltages applied to the memory structure 126 during a memory operation. The timing of the signals in FIG. 6 is controlled by CTC signals, in an embodiment.

A low voltage is applied to the source line at step 622. Referring to FIG. 6, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 6 are at 0V at time t0.

At step 624, the data is applied to the bit lines. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Figure 7:
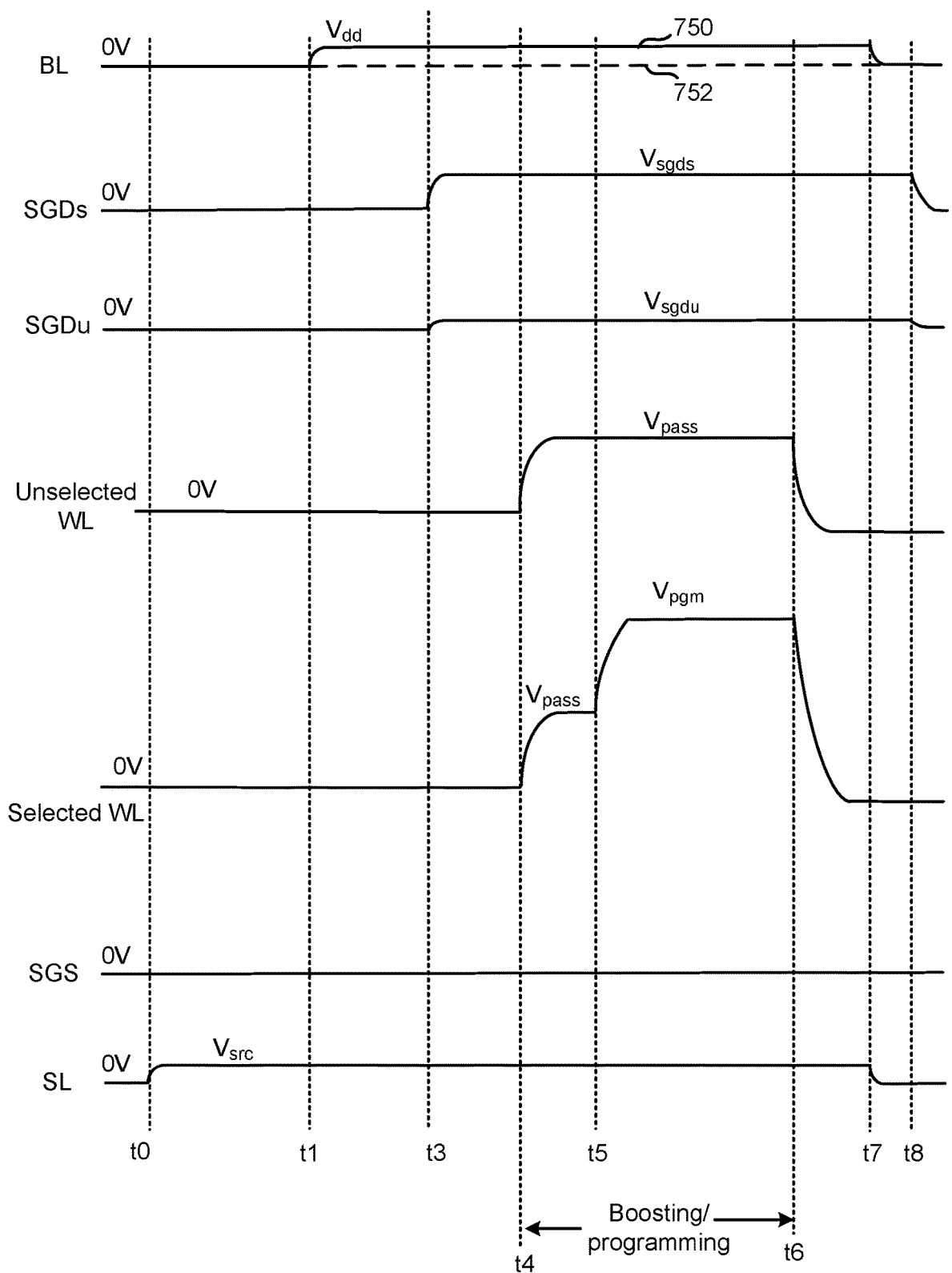
FIG. 7 shows timing of various signals during one embodiment of the process of FIG. 6.

Referring to FIG. 7, line 752 shows the bit line voltage at 0V for a NAND string (in the set that are a part of the present programming operation) having a memory cell at the selected word line WLn that is to be programmed. Line 750 shows the bit line voltage at VDD for a NAND string (in the set that are a part of the present programming operation) having a cell at WLn that is to be inhibited from programming. VDD designates program inhibit and is often referred to as a program inhibit voltage. Note that line 752 represents one example of V_Program_Enable, and that line 750 represents one example of Vbl_Inhibit.

Step 626 is to apply Vsgds to selected drain side select lines. Step 628 is to apply Vsgdu to unselected drain side select lines. Note that FIG. 7 shows two SGD lines. Line SGDs refers to a drain side select line having at least one NAND string that is currently programming. Line SGDu refers to a drain side select line having no NAND strings currently programming.

Referring to FIG. 7, at time t3, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time t3.

Note that at this time Vsgds may also be applied to control gates of drain side select transistors of NAND strings for which no memory cell should be programmed. However, note that Vbl_Inhibit is being applied to the unselected bit line BL1 at time t3.

Referring again to FIG. 7, at time t3, drain side select line SGDu is set to Vsgdu. The voltage Vsgdu should keep off the associated drain side select transistor.

At step 636, a boosting voltage (e.g., VpAss) is applied to unselected word lines. Note that the magnitude for VpAss does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 7, at time t4, the boosting/programming phase begins. The boosting voltages are applied to the various word lines at time t4. In one embodiment, each unselected word line receives a boosting voltage VpAss. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 8 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 638. With the boosting voltages applied and the inhibited NAND string channels boosted, program disturb of unselected memory cells on the selected word line is prevented or reduced.

Referring to FIG. 7, at time $t_5$, the program voltage $V_{PGM}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 640, the word lines, bit lines, source lines, and drain select lines are lowered to 0V, marking the completion of one programming iteration. It should be noted that the steps of FIG. 6 can be applied with each iteration of the process of FIG. 5, with the program voltage being increased each iteration. However, it is not required that the program voltage increase in magnitude with each iteration.

Referring to FIG. 7, at time t6, the word lines are lowered to 0V. The source and bit lines are then lowered to 0V at time t7. The drain select line SGD is lowered to 0V at time t8.

Numerous variations to the signals depicted in FIG. 7 can be made in accordance with embodiments. Also note that timing and/or magnitudes of the voltages in FIG. 7 (as well as other memory array signals) can be modified by modifying instructions executed by the MCU 112. For example, if it is determined that the length of time for which the programming voltage is applied should be changed, then the instructions can be modified to change the length of time between t5 and t6 in FIG. 7. In one embodiment, this change is made by changing the timing of setting/resetting CTC signals, which in turn control the timing of the voltages in FIG. 7. Many other modifications to memory array voltages can be made by modifying instructions executed by the MCU 112 and/or by modifying data that the MCU 112 uses to execute the instructions.

Figure 8:
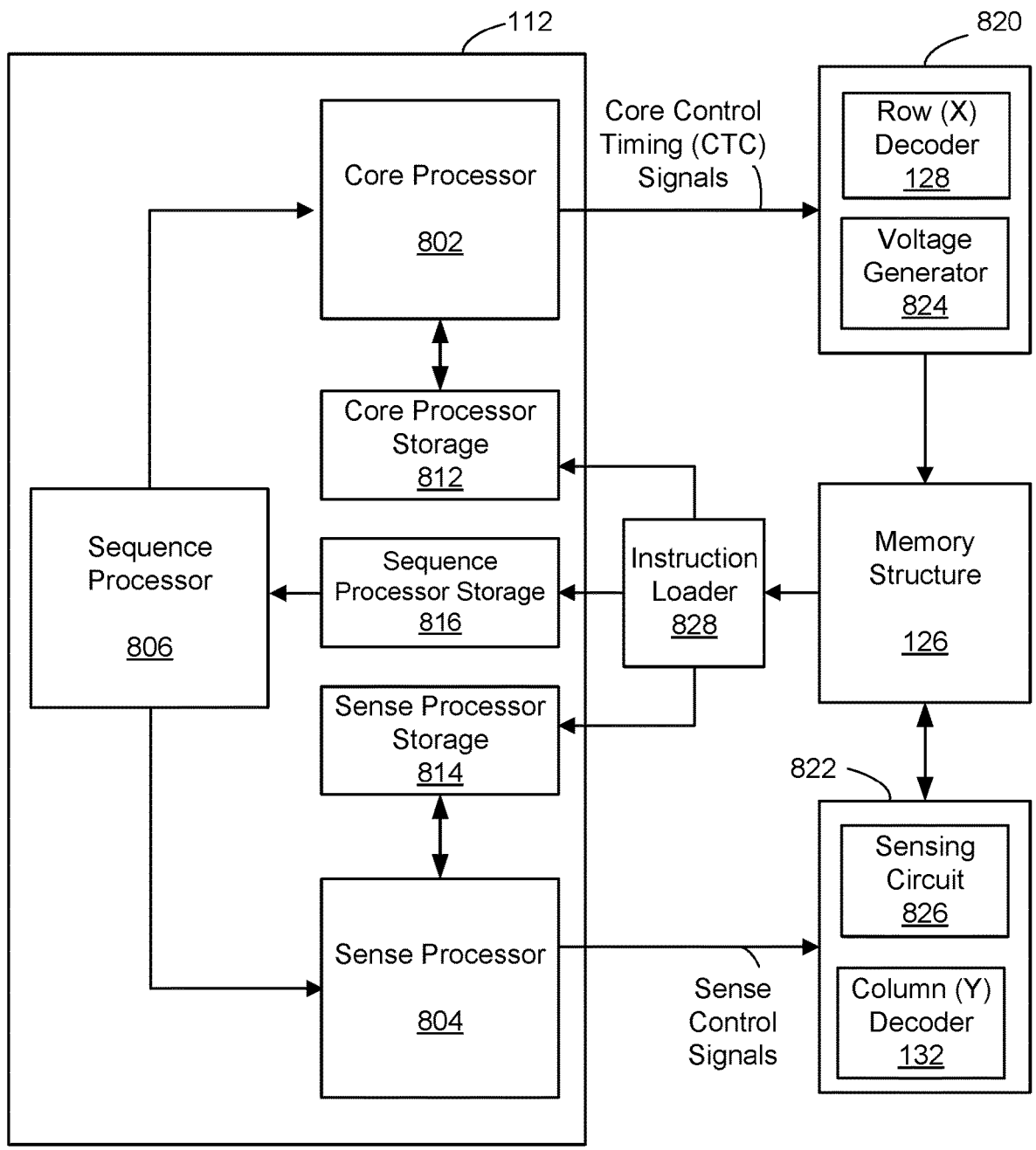
FIG. 8 is a high-level block diagram of one embodiment of a microcontroller, having three processors, and other elements.

FIG. 8 is a high-level block diagram of one embodiment of microcontroller 112, and other elements. The other elements include a memory structure 126, which contains non-volatile memory cells, first circuit 820, and second circuit 822. Microcontroller 112 provides on-die control for reading, programming, and erasing the non-volatile memory cells of memory structure 126. Additionally, microcontroller 112 provides on-die control for interfacing with controller 122.

The first circuit 820 includes a voltage generator 824 and row decoder 124. The first circuit 820 is configured to apply voltages to the memory structure 126. This may include voltages to one or more of word lines, select lines (e.g., SGD, SGS), source lines, as well as other elements in the memory structure 126. The first circuit 820 may include decoders (e.g., row decoder 124) and charge pumps, which provide the voltages for word lines, select lines (e.g., SGD, SGS), source lines, as well as other elements in the memory structure 126. The first circuit 820 may include power control circuit 116 and/or on-chip address decoder 114. In one embodiment, the first circuit 820 includes one or more of the elements in FIG. 4 that are connected to the blocks 300, 320. For example, the voltage generator 824 may include high-voltage voltage drivers 350 (each driver may include an on-chip charge pump). The row decoder 124 may include one or more of block decoder (BD) 322, transfer transistors 304-314, 324-334. The first circuit 820 may include other elements from FIG. 3 such as CONTROL 380, HV GEN 372, CMD REG 376, and/or ADD REG 370. Note that the first circuit 820 is not limited to the embodiment depicted in FIG. 3.

The second circuit 822 is configured to test conditions of the non-volatile memory cells in response to the voltages applied to the memory structure 126. The second circuit 822 includes sensing circuit 826 and column decoders 132. The sensing circuit 826 may include and control sense amplifiers that sense a current of a memory cell.

In one embodiment, the sensing circuit 826 includes all or a portion of a sense block (see, for example, SB1 in FIG. 1B). For example, sensing circuit 826 may include sense modules (e.g., SM0, SM1, SM2, SM3) and data latches (e.g., latches 194). In one embodiment, sensing circuit 826 includes data latch processor 192 (see FIG. 1B). In one embodiment, data latch processor 192 tests conditions of the non-volatile memory cells in response to the voltages applied to the memory structure 126. The second circuit 822 may include one or more managing circuits (e.g., MC0, FIG. 1B). It is not required that the sensing circuit 826 include all of the elements in the MC0 depicted in FIG. 1B. Also, the sensing circuit 826 may include elements not depicted in MC0 of FIG. 1B. In one embodiment, the second circuit 822 includes page buffer 340, PB DRV 374, and I/O 378 (see, FIG. 3). Note that CONTROL 380 may be shared between the first circuit 820 and the second circuit 822.

The microcontroller 112 includes a core processor 802 a sense processor 804, and a sequence processor 806. The sequence processor 806 may also be referred to as a main processor. The core processor 802 sends control signals to the first circuit 820. The control signals may be referred to as CTC signals. The control signals could be analog or digital signals. The control signals may be sent over a communication medium. A communication medium may comprise one or more signal lines. A signal line is capable of transmitting an electrical signal, such as a voltage level, in some embodiments. For example, a signal line may be an electrically conductive path. A signal line is capable of transmitting an electromagnetic signal, such as an optical signal (e.g., light pulse), in some embodiments. For example, a signal line may comprise an optical waveguide. In embodiments, a signal line may include, but is not limited to, one or more of a wire, trace, transmission line, track, pad, layer, lead, metal, portion of a printed circuit board or assembly, conducting material and other material that may transfer or carry an electrical signal, and/or electromagnetic signal. In embodiments, a signal line may form one or more geometric shapes, such as a line or multiple connected lines. In embodiments, a signal line may be unidirectional or bidirectional in transferring signals between circuits and within circuits. Note that the communication medium may comprise elements other than the signal lines, such as drivers, buffers, or logic gates.

The core processor 802 is configured to control the first circuit 820 to control analog voltages (e.g., word line voltages, select line voltages, etc.) applied by the first circuit 820 to the memory structure 126, in one embodiment. The core processor 802 is configured to control decoders and charge pumps in the first circuit 820, in one embodiment. The core processor 802 is configured to control voltage levels applied by sense amplifiers, in one embodiment. Note that throughout this description, the phrase, "a processor is configured to control a circuit" or the like, does not require that the processor control all functionality of the circuit.

Note that the timing of the sequences of voltages applied by the first circuit 820 in order to program, read, or erase memory cells may be very complex. In some embodiments, a core timing chart specifies the timing of the sequences of CTC signals that are used to control the voltages applied by the first circuit 820. FIG. 7 shows one example of timing of the sequences of voltages applied during a programing operation. The core processor 802 is configured to issue CTC signals for different memory operations, in one embodiment. Thus, the core processor 802 may be configured to execute first instructions to coordinate sequences of voltages applied to the memory structure 126 by the first circuit 820 in order to perform memory operations with respect to non-volatile memory cells in the memory structure 126. The memory operations could be, for example, read, program, and/or erase operations. The core processor 802 may also be referred to as a core machine (CM).

The sense processor 804 sends control signals to the second circuit 822. The control signals could be analog or digital signals. The control signals may be sent over a communication medium. As noted above, a communication medium may comprise one or more signal lines, and may also comprise drivers, buffers, and/or logic gates. The sense processor 804 is configured to execute second instructions to control the second circuit 822 to test conditions of the non-volatile memory cells in response to the voltages applied to the memory structure 126. The manner in which the conditions may be tested may include, but is not limited to, sensing, reading, detecting, measuring, probing, discovering, discriminating, checking, examining, and determining. For example, the sense processor may control the second circuit 822 to determine a data state of the non-volatile memory cells. In one embodiment, the sense processor 804 sends control signals to data latch processor 192 (see FIG. 1B).

In one embodiment, the sense processor 804 controls the sensing circuit 826 to test conditions of non-volatile memory cells in memory structure 126 in response to voltages applied to the memory structure 126 (such as reference voltages applied to the non-volatile memory cells) by the voltage generator 824. The condition of a non-volatile memory cell can be any physical parameter of a non-volatile memory cell. In one embodiment, the sense processor 804 controls the sensing circuit 826 to determine a data state (e.g., S0-S7 in FIG. 4) of memory cells. In one embodiment, the sense processor 804 controls the sensing circuit 826 to determine whether a memory cell conducts a current in response to voltages applied to the memory cell by the voltage generator 824. In one embodiment, the sense processor 804 controls the sensing circuit 826 to determine whether the threshold voltage of a memory cell is above or below a reference voltage (e.g., Vr1-Vr7; Vv1-Vv7 in FIG. 4) applied to the memory cell.

For example, with reference to FIG. 4, the sense processor 804 may control the second circuit 822 to determine which of the data states (e.g., S0-S7) each of a set of memory cells is in. In one embodiment, the sense processor 804 controls the second circuit 822 to test whether selected memory cells have a threshold voltage above or below a reference voltage applied by the power control circuit 116. The reference voltage might be one of Vr1-Vr7, with reference to FIG. 4, in the event that a read operation is being performed. The reference voltage might be one of Vv1-Vv7, with reference to FIG. 4, in the event that a program verify operation is being performed. The sense processor may alternatively be referred to as a Y processor (YP) or Y machine (YM) due to the association between sensing and the Y-decoder 132, in some embodiments. In one embodiment, the sense processor 804 executes instructions in the second processor storage 814 in response to a trigger signal from the core processor 802. This allows the core processor 802 to control the timing of sensing operations relative to the timing of voltages applied to the memory structure 126 by the first circuit 820. Stated another way, this allows the activities (e.g., sensing) of the second circuit 822 to be coordinated with the activities (e.g., applying voltages to the memory structure 126) of the first circuit 820. For example, during a sensing operation, the core processor 802 can control the first circuit 820 to establish appropriate voltage levels applied to memory cells; then, after appropriate voltage levels are applied to memory cells, the core processor 802 can trigger the sense processor 804 to initiate a sensing operation (by the sense processor 804 controlling the second circuit 822). The trigger signal may be an analog or digital signal. In one embodiment, the trigger signal has two states: logical high (which triggers the sense processor) and logical low (which does not trigger the sense processor).

The core processor storage 812, the sense processor storage 814, and the sequence processor storage 816 are tangible, non-transitory storage. The non-transitory storage could be volatile or non-volatile. The core processor storage 812 is used to store first instructions that are executed by the core processor 802. The core processor storage 812 may also be used to store parameters that the core processor 802 applies when executing the first instructions. The sense processor storage 814 is used to store second instructions that are executed by the sense processor 804. The sense processor storage 814 may also be used to store parameters that the sense processor 804 applies when executing the second instructions. The sequence processor storage 816 is used to store third instructions that are executed by the sequence processor 806. The sequence processor storage 816 may also be used to store parameters that the sequence processor 806 applies when executing the third instructions. The MCU 112 may have other processors, such as a parameter processor that control various memory operation parameters.

In one embodiment, a copy of the first instructions (and possibly parameters used by core processor 802), a copy of the second instructions (and possibly parameters used by sense processor 804), and a copy of the third instructions (and possibly parameters used by sequence processor 806) are stored in non-volatile storage in order to persist the instructions (and possibly parameters) across power cycles.

Those copies may be loaded into a volatile storage, which is accessed by the respective processors 802, 804, 806. For example, the instruction loader 828 may load a copy of the instructions (and possibly parameters) from the memory structure 126 into the core processor storage 812, the sense processor storage 814, and the sequence processor storage 816. In one embodiment, the instruction loader 828 is configured to update the instructions in any of the core processor storage 812, the sense processor storage 814 and/or the sequence processor storage 816. By update, it is meant that different instructions are stored to storage 812, 814, and/or 816 (relative to a previous time instructions were stored to storage 812, 814, and/or 816) by accessing different (or updated) instructions from memory structure 126. Note that although the core processor storage 812, the sense processor storage 814 and the sequence processor storage 816 are depicted as within the microcontroller 112, the core processor storage 812, the sense processor storage 814 and/or the sequence processor storage 816 may reside outside of the microcontroller 112.

Note that the instructions and/or parameters in the core processor storage 812, the instructions and/or parameters in the sense processor storage 814 and/or the instructions and/or parameters in the sequence processor storage 816 can be modified to allow the operation of the core processor 802 and/or sense processor 804 and/or sequence processor 806 to be modified. For example, the instructions which the core processor 802 executes could be modified to change the timing of applying voltages to the memory structure 126. In one embodiment, the instructions are modified to change when CTC signals are set/reset in order to change the timing of applying voltages to the memory structure 126.

The core processor 802, the sense processor 804, and the sequence processor 806 are able to fetch, decode, and execute instructions from their respective processor storage (812, 814, 816), in one embodiment. The core processor 802, the sense processor 804 and the sequence processor 806 can be implemented as microprocessors, in one embodiment. A microcontroller 112 may comprise one or more processors that process and/or execute microcode or other computer executable code (e.g., an instruction set) to perform tasks or operations. The core processor 802, the sense processor 804 and the sequence processor 806 may each comprise elements such as of flip flops, latches, RAM/ROM, combinational logic, etc. In one embodiment, the core processor 802, the sense processor 804 and the sequence processor 806 are implemented using CMOS technology. The microcontroller 112 is positioned on the substrate underneath the memory array, in one embodiment. The microcontroller 112 resides on the same memory die as the memory structure 126, in one embodiment. The microcontroller 112 resides on the same memory die as the memory structure 126, first circuit 820, and second circuit 822, in one embodiment.

In some embodiments, the MCU 112 pre-computes information from which CTC signals may be derived. In one embodiment, the pre-computed information includes conditions that are relevant for the non-volatile memory structure 126 and from which the control signals for a type of memory operation are derivable. In one embodiment, the pre-computed information includes set/reset information that specifies when the CTC signals are to be set or reset. The pre-computed information may be stored in core processor storage 812, the sense processor storage 814, and/or the sequence processor storage 816. In one embodiment, the information is pre-computed and stored during a power on phase. However, the information could be pre-computed and stored after the power on phase. The MCU 112 may access the pre-computed information during runtime in order to generate the CTC signals for the type of memory operation. Therefore, time and/or power may be saved each time that a memory operation of the type is executed at runtime.

The instruction loader 828 may take the form of packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each instruction loader 828 may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, instruction loader 828 may include or comprise software stored in a processor readable device (e.g., memory) to program a one or more processors to perform the functions described herein.

FIG. 9 is a more detailed block diagram of one embodiment of microcontroller 112. In one embodiment, the circuit of FIG. 9 is an example implementation of the circuit of FIG. 8. Command synchronizer 902, which receives commands from controller 122, is connected to Sequence processor 806. FIG. 9 shows Sequence processor 806 connected to parameter manager 906, Command (CMD) FIFO 922, FIFO manager 924, and sense processor 804. Parameter FIFO 920 is connected to parameter manager 924 and FIFO manager 924. CMD FIFO is also connected to FIFO manager 924. Core processor 802 is connected to FIFO manager 924, sense processor 804 and a plurality of ROM Groups (ROM Group 0, ROM Group 1, ... ROM Group N). Core processor 802 is connected to the first circuit 820. Sense processor 804 is connected to second circuit 822. Memory structure 126 is connected to first circuit 820 and second circuit 822. In one embodiment, all of the components depicted in FIG. 9 are on the same memory die.

Sequence processor 806 includes a processor (e.g., a ROM or RAM, and at least one control unit that fetches data and instructions from RAM/ROM and performs some logic operation), parameter manager 906 includes a processor, FIFO manager 924 includes a combinational logic circuit, core processor 802 includes a processor, and sense processor 804 includes a processor. In one embodiment, all of the components of FIG. 9 receive the same clock signal.

Command synchronizer 902 receives commands from controller 122 and synchronizes the command to the clock signal. It then encodes the commands and sends the commands to sequence processor 806, where control of the internal flow takes place.

Sequence processor 806, which is the master of parameter manager 906 and FIFO manager 924, executes each command. It works out the clock sequence to provide main clock and sub-clock initiators downstream. For each main clock, sequence processor 806 starts the parameter manager 906 (Parameter Control Signal 934)) to perform calculations such as biasing voltages and temperature calibration. For each sub-clock, sequence processor 806 sends a command packet 930 to CMD FIFO 922. That command packet 930 is decoded by the slave modules FIFO manager 924, core processor 802 and sense processor 804 to execute the operation. Parameter manager provides its output to Parameter FIFO 920, which can then be accessed by FIFO manager 924. Sequence processor 806 also provides a signal 932 to suspend an operation being performed.

Sequence processor 806 is connected to CTC cache 938a. CTC cache 938a may be used to store conditions from which the CTC signals for a type of memory operation, or segment thereof, may be generated. Note that is it not required to store the conditions for all types of memory operations. In one embodiment, the conditions are computed by the sequence processor 806 during a power on phase and stored in the CTC cache 938a. In one embodiment, the conditions are computed by the sequence processor 806 during runtime and stored in the CTC cache 938a during runtime (but before a request to perform a memory operation of a certain type is received). In one embodiment, during runtime, when a request to perform a memory operation of that type is received, the sequence processor 806 accesses these stored conditions rather than computing the conditions. Accessing the stored conditions may allow the sequence processor 806 to meet a timing budget. For example, the sequence processor 806 may have a limited number of clock cycles to determine the conditions for a particular segment of a memory operation. For some segments of some memory operations, there might not be enough clock cycles for the sequence processor 806 to compute the conditions.

Core processor 802 is a slave to FIFO manager 924. Core processor 802 generates control signals (e.g., CTC signals) for first circuit 820. Thus, core processor 802 manages the voltage signals to one or more of word lines, bit lines, select lines (e.g., SGD, SGS), source lines, as well as other elements in the memory structure 126. In one embodiment, core processor 802 is processor 804 of FIG. 8, or performs the same functions and controls the same signals as processor 804. For each sub-clock, core processor 802 takes a command packet 930 (or multiple command packets) from CMD FIFO 922 (via FIFO manager 924) and may perform a look-up and use the result of the look-up to generate the CTC signals to first circuit 820 in order to update the voltage signals to memory structure 126. In one embodiment, the voltage signals to memory structure 126 are divided into groups of signals where the signals of a group are updated together. Based on the conditions at each moment, core processor 802 may perform a look-up for each group to modify the signals for that particular group.

Core processor 802 is connected to the plurality of ROM Groups (ROM Group 0, ROM Group 1, ... ROM Group N). In one embodiment, each ROM Group stores information to perform one operation (e.g., read, write, erase, etc.). In another embodiment, each ROM Group stores information to perform one option for an operation or part of an operation. In yet another embodiment, each ROM Group stores information to generate one waveform for an operation.

Core processor 802 is connected to CTC cache 938b. CTC cache 938b may be used to store information from which CTC signals may be generated. In one embodiment, this information is computed during a power on phase and stored in the CTC cache 938b. However, the information may be computed and stored in the CTC cache 938b after the power on phase. In one embodiment, this information includes conditions from which the CTC signals are derivable. These conditions may be computed by the sequence processor 806. In one embodiment, this information may include set/reset information that indicates when voltages applied to the memory structure 126 are to be set or reset. Note that it is not required to use both CTC cache 938a and CTC cache 938b. In one embodiment, both caches 938a, 938b are used. In one embodiment, only CTC cache 938a is used. In one embodiment, only CTC cache 938b is used. The CTC caches 938a, 938b may be implemented in volatile or non-volatile storage. In one embodiment, CTC latches 938a, 938b are implemented by latches.

Sense processor 804 generates and applies a set of control signals to second circuit 822, which is configured to test conditions of the non-volatile memory cells in response to the voltages applied to the memory structure 126. In one embodiment, sense processor 804 is processor 806 of FIG. 8, or performs the same functions and controls the same signals as processor 806. The command packets 930 may also include control information for sense processor 804 to perform tasks. Sense processor 804 provides Feedback 936 to Sequence processor 806.

Figure 10A:
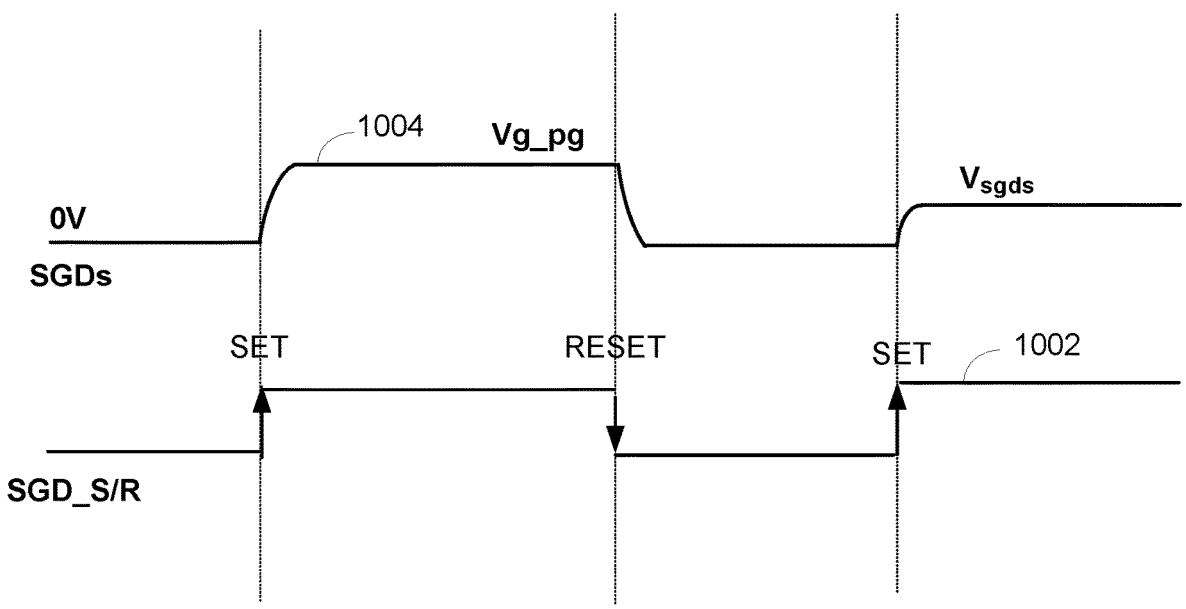
FIG. 10A is a diagram that shows how a CTC signal may be used to control a voltage waveform during an embodiment of a memory operation.

FIG. 10A is a diagram that shows how a CTC signal may be used to control a voltage waveform during an embodiment of a memory operation. A CTC signal 1002, referred to as SGD S/R is used to control the voltage waveform 1004 referred to as SGDs. The timing is performed in relation to what are referred to herein as "sub-clocks" 1006. A sub-clock refers to a specific segment of a memory operation. There 16 sub-clocks 1006 in the example in FIG. 10A. The sub-clocks 1006 do not necessarily each have the same time duration. In this example, the CTC signal 1002 is SET during sub-clock 4, RESET during sub-clock 9, and SET during sub-clock 13. As a result, the voltage waveform 1004 transitions from a steady state value (e.g., 0V) to a level of Vg_pg at sub-clock 4, transitions back down to the steady state value at sub-clock 9, and transitions from the steady state value to Vsgds at sub-clock 13. In some embodiments, the magnitudes of Vg_pg and Vsgds are controlled by the Analog Signals from the parameter manager 906.

The CTC signal 1002 is one of many CTC signals that are issued to control different memory operations. In one embodiment, a specification describes the pulse shapes (e.g., start times, durations, magnitudes). This specification could cover waveforms such as the examples in FIG. 7 for a programming operation, as well as many other memory operations. From this specification, a combination of Excel macros and a script may be used to generate a set/reset (SR) table, which defines on what time and under what conditions each CTC signal needs to be set or reset. From this SR table, a master table may be generated.

FIG. 10B depicts one example of a portion of a master table 1050 for CTC signals. The column labeled "CTC signal" specifies the CTC signal for that row of master table 1050. A total of five different CTC signals are shown in the table, but typically there are many more CTC signals. For example, there could be more than 100 different CTC signals. In one embodiment, there are about 160 different CTC signals.

The mode column specifies the mode for the CTC signal for that row. In this example, the modes include program and read. There could be other modes such as verify and erase. The sub-mode column specifies the sub-mode for the CTC signal for that row. For the program mode, there is an "all bit line" (ABL) program mode, an SLC program mode, and an MLC program mode. There may be many other sub-modes for the program mode. For the read mode, there is an SLC read mode, and an MLC read mode. There may be many other sub-modes for the read mode.

The main clock column specifies the main clock for the CTC signal in that row. Two main clocks are shown (P_CLK for program, and R_CLK for read). It could take more than one main clock to complete a memory operation such as program or read. For example, the time frame for the voltage waveforms in FIG. 7 may correspond to a P_CLK. There may be additional main clocks needed to complete the program operation. In one embodiment, there are about 20 different main clocks.

The sub-clock column specifies the sub-clock for the CTC signal in that row. A sub-clock defines a segment of a memory operation. The sub-clocks do not necessarily last the same time. Hence, the segments may have different durations. A sub-clock is a portion of main clock, in one embodiment. For example, the time frame for the voltage waveforms in FIG. 7 may contain numerous different sub-clocks. As one example, each time (t0, t1, etc.) in FIG. 7 may correspond to a sub-clock. However, note that there may be additional sub-clocks to account for the need to change a voltage waveform not depicted in FIG. 7. As a further example, the time period in FIG. 10A may correspond to one main clock, which has 16 sub-clocks. Note that the sub-clocks in FIG. 10A may be given names such as p1, p2, etc. to distinguish over sub-clocks associated with other main clocks. In one embodiment, there are about 130 different sub-clocks.

In one embodiment, the condition column specifies the condition under which the CTC signal in that row is to be set or reset during the sub-clock. The conditions are calculated based on a Boolean equation in one embodiment. The various letters (A, B, etc.) in the table 1050 pertain to various factors that indicate whether the condition is met for the sub-clock. For example, one of the factors might be whether a voltage (e.g., program voltage, boost voltage, kick voltage, read voltage, etc.) should be initiated or stopped. Another factor could be a mode of operation (e.g., SLC, MLC, ABL). There could potentially be hundreds, or even thousands of different conditions.

The Set/Reset column specifies whether the CTC signal in that row is to be set or reset during the sub-clock in response to the condition being met.

Figure 11A:
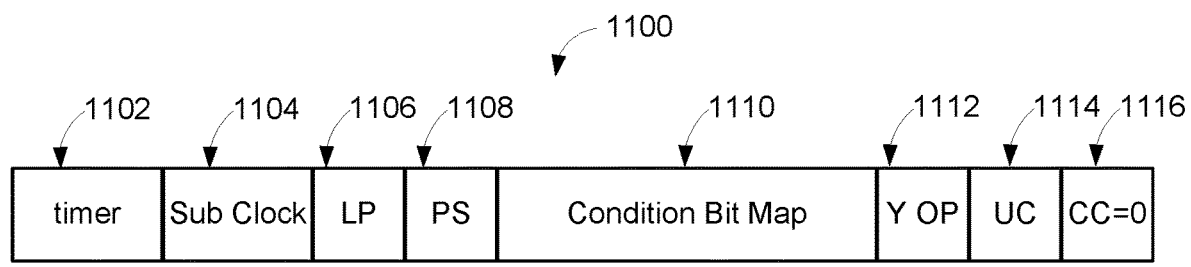
FIG. 11A illustrates an embodiment of a packet that contains information that may be used by the MCU to generate one or more CTC signals.

FIG. 11A illustrates an embodiment of a packet 1100 that contains information that may be used by the MCU 112 to generate one or more CTC signals. The packet 1100 is generated by the sequence processor 806, in an embodiment. The sequence processor 806 places the packet into CMD FIFO queue 922, in an embodiment. The core processor 802 accesses the packet 1100 from the FIFO and decodes the packet. Based on information in the packet 1100, the core processor 802 generates CTC signals. There may be multiple such packets 1100 for a single memory operation, in an embodiment. For example, the core processor 802 may process multiple packets 1100 in order to generate the CTC signals for a memory command (e.g., read command, write command, or erase command).

The packet 1100 contains a sub-clock field 1104, which contains a label for the sub-clock of the memory command. As noted above, a sub-clock refers to a segment of a memory command. The label is specified as a digital value, in an embodiment. A timer field 1102 specifies the number of clock cycles for the sub-clock.

Many sub-clocks only need a single packet. However, in some cases, more than one packet is used for a single sub-clock. A last packet (LP) field 1106 indicates whether this is the last packet in a multiple packet sequence for this sub-clock. This field 1106 may be a single bit.

A parameter machine (PM) field 1108 indicates whether the parameter manager 906 needs to refresh the parameter FIFO queue 920 output. Thus, note that a packet may be used to by the parameter manager 906, as well as the core processor 802.

Condition bit map 1110 is a bit map that specifies the conditions that apply for this sub-clock. The conditions are applicable to at least one CTC signal, in an embodiment. The CTC signals are divided into groups, in an embodiment. Thus, the conditions that are met for this sub-block are not necessarily applicable to each group of CTC signals. Each bit in the condition bit map 1110 specifies a different condition, in an embodiment. In one embodiment, the condition bit map 1110 is 18 bits. However, the condition bit map 1110 could be larger or smaller. In some cases, there may be more conditions for a sub-clock than there are bits in the condition bit map. In this case, more than one packet 1100 may be used to specify all of the conditions for this sub-clock. The last packet field is used to indicate whether or not there is another packet for the sub-clock. Note that there may be hundreds, or even thousands of possible conditions. Therefore, it will be appreciated that different conditions are being specified by the specific bits in the condition bit map for different sub-clocks.

In one embodiment, for some types of memory operations, the sequence processor 806 computes the conditions for the condition bit map 1110 in real time, as the memory operation is being processed. However, for other types of memory operations, the sequence processor 806 does not compute the conditions for the condition bit map 1110 in real time. The foregoing may apply on a sub-clock basis. Thus, for one sub-clock of a memory operation, the sequence processor 806 may compute the conditions for the condition bit map 1110 in real time, as the memory operation is being processed. However, for another sub-clock of the memory operation, the sequence processor 806 does not compute the conditions for the condition bit map 1110 in real time.

In one embodiment, the use cache (UC) flag 1114 indicates that cached (or stored) information should be used by the core processor 802 instead of the condition bit map 1110. Thus, in one embodiment, when the UC flag 1114 is set, the condition bit map 1110 is not valid. Instead, when the core processor 802 decodes the packet 1100, the core processor 802 will use cached information (e.g., a cached condition bit map in CTC cache 938b) instead. Thus, the sequence processor 806 need not compute the condition bit map 1110 in real time. As an alternative, the sequence processor 806 could access the cached information (e.g., a cached condition bit map in CTC cache 938a) and use that to fill in the condition bit map 1110 in the packet 1100. Again, the sequence processor 806 need not compute the condition bit map 1110 in real time. However, in the event that the sequence processor 806 uses cached information in the CTC cache 938a, and the core processor 802 does not use cached information in CTC cache 938b, the UC flag 1114 is not set. In other words, since in this case the core processor 802 does not use cached information in CTC cache 938b, there is no need to set the UC flag 1114 to instruct the core processor 802 to use cached information in CTC cache 938b.

The Y OP field 1112 contains control information for the sense processor 804. Thus, the packet 1100 may be used to control operation of the sense processor 804, in an embodiment. The Create Cache flag (CC) 1116 is set to 0 for packet 1100, which indicates that the core processor 802 is not to create a cache entry in CTC cache 938b for packet 1100. The Create Cache flag (CC) 1116 will be discussed in more detail in connection with FIG. 11B.

Figure 11B:
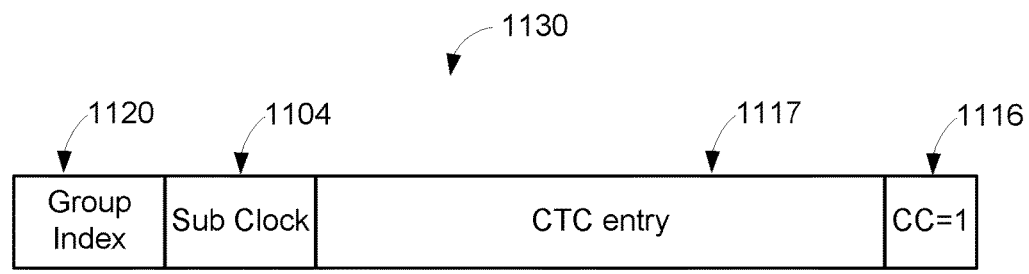
FIG. 11B illustrates an embodiment of a packet that contains information that may be used to cache information for generating one or more CTC signals.

In one embodiment, the sequence processor 806 sends a packet to the core processor 802 during a power on phase in order to instruct the core processor 802 to cache information in the packet. In one embodiment, the sequence processor 806 sends a packet to the core processor 802 during runtime in order to instruct the core processor 802 to cache information in the packet. FIG. 11B illustrates another embodiment of a packet 1130 that contains a Create Cache flag (CC) 1116, which is set to 1 to indicate that an entry is to be created in CTC cache 938*b*. Packet 1130 has a CTC entry 1117, which is cached in the CTC cache 938*b*. Thus, the Create Cache flag (CC) 1116 indicates to the core processor 802 that the CTC entry 1117 should be cached in CTC 938*b* for future use. The packet 1130 in FIG. 11B contains a sub-clock field 1104 and a Group Index field 1120. In one embodiment, the Group Index field 1120 occupies the same bits that were used in packet 1100 for the timer 1102, which is not used in packet 1130. The Group Index 1120 may be used to specify a group of signals. As has been discussed in connection with FIG. 9, the CTC signals may be divided into groups. Thus, when storing the CTC entry 1117, the information may be stored with an indication that it is specific to one group of CTC signals. Note that it is not required to use the packet in FIG. 11B to cache the information. In one embodiment, the information is directly cached by, for example, the sequence processor 806. Also, there is no need for fields for LP 1106, PM 1108, YOP 1112, or UC 1114 in packet 1130. In one embodiment, the CTC entry 1117 occupies the same number of bits as the LP 1106, PS 1108, condition bit map 1110, Y OP 1112, and UC 1114 in packet 1100. For example, the CTC entry 1117 may be 30 bits. The LP 1106, PS 1108, condition bit map 1110, Y OP 1112, and UC 1114 may combined be 30 bits. However, more or fewer than 30 bits could be used.

Figure 12:
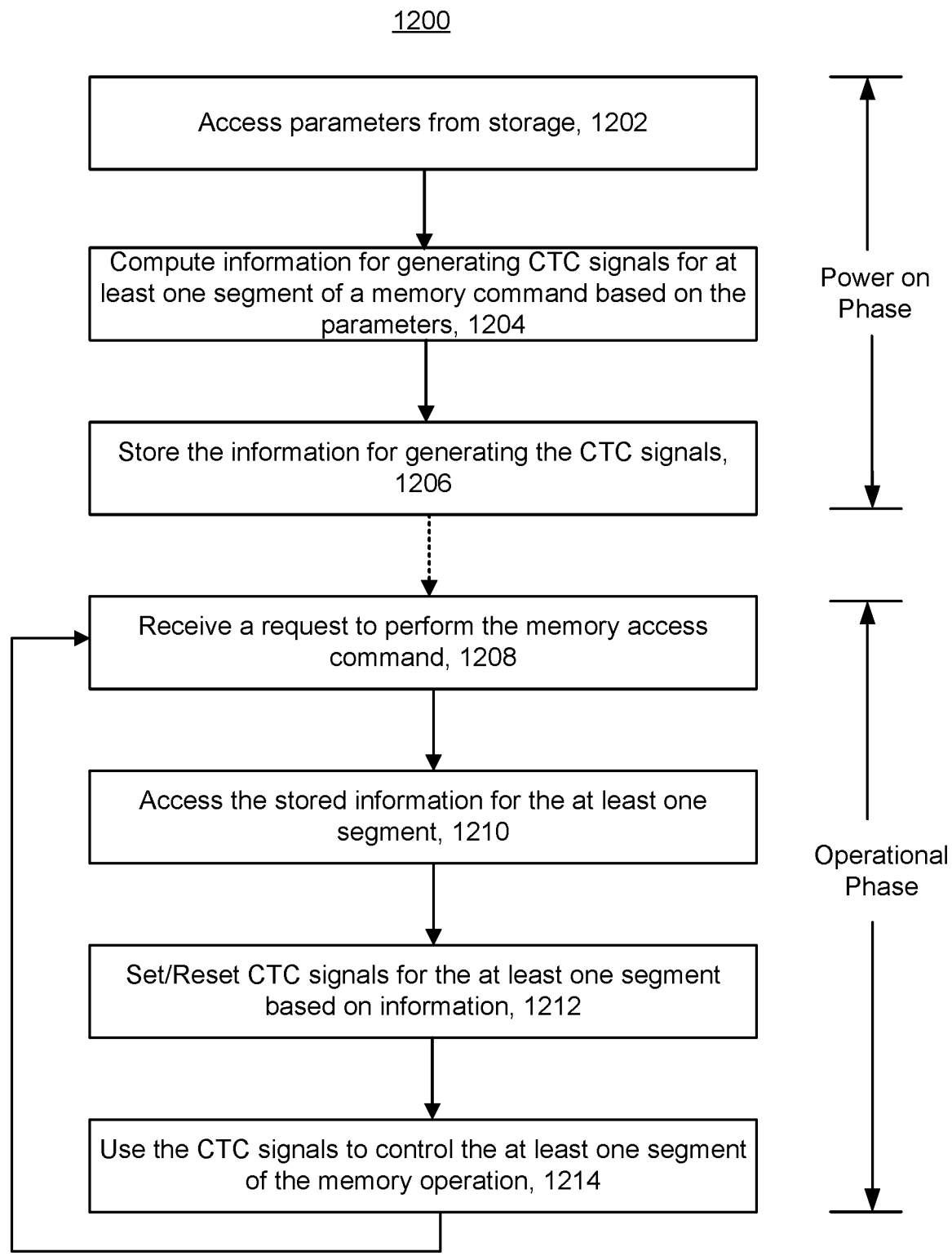
FIG. 12 depicts a flowchart of one embodiment of a process of generating CTC signals for a memory operation or segment thereof.

FIG. 12 depicts a flowchart of one embodiment of a process 1200 of generating CTC signals for a memory operation or segment thereof. Process 1200 is performed by MCU 112. In one embodiment, steps 1202-1206 may be performed during a power on phase. Steps 1208-1214 may be performed during an operational phase in which requests to perform the memory operation are received. Note the process 1200 is not required to be performed for all types of memory operations. For example, process 1200 might be performed for a read operation, but not be performed for an erase operation or a program operation. Also, even if process 1200 is performed for a memory operation (e.g., an MLC read), the process 1200 is not required to be performed for all sub-clocks of the memory operation.

Step 1202 includes accessing parameters from storage on the non-volatile memory system. In one embodiment, MCU 112 accesses the parameters from buffers 130. The parameters may include default parameters, voltages, and the like for memory operations.

Step 1204 includes computing information for generating CTC signals for at least one segment of a memory command, based on the parameters. In one embodiment, separate information is computed for each segment for which information is pre-computed. In one embodiment, the information includes the condition bit map 1110. In one embodiment, the information includes the CTC entry 1117. In one embodiment, the MCU 112 computes the condition bit map 1110 (or alternatively the CTC entry 1117) for a sub-clock of a memory operation or segment of the memory operation. In one embodiment, the condition bit map 1110 (or alternatively the CTC entry 1117) is computed based on a combination of modes (or sub-modes), parameters, and/or state dependent bits. In one embodiment, the information includes set/reset information that indicates whether a voltage applied to the memory structure 126 is to be set or reset during a sub-clock of the memory operation. In one embodiment, the MCU 112 computes the set/reset information.

Step 1206 includes storing the information that was computed in step 1204. In one embodiment, the information is stored in latches in the MCU 112. In one embodiment, the information is stored in CTC cache 938*a*. For example, sequence processor 806 may store the information in CTC cache 938*a*. In some embodiments, the information is stored in CTC cache 938*b*.

In one embodiment of step 1206, the sequence processor 806 places a packet (e.g., packet 1130 in FIG. 11B) on the CMD FIFO 922, which is accessed by the core processor 802. The packet may contain a CTC entry 1117, which was computed by the sequence processor 806 in step 1204. The packet may also contain a CC flag 1116, which is set to 1 to indicate that the condition bit map 1110 should be cached in CTC 938*b* by the core processor 802. The core processor 802 decodes the packet and may store the information in the CTC cache 938*b*.

However, it is not required to use this technique in which the sequence processor 806 sends the packet 1130 to be able to cache the information. In one embodiment of step 1206, the sequence processor 806 stores the information in CTC cache 938*b*, without generating a packet 1130. For example, the sequence processor 806 may compute conditions that would otherwise be placed in the condition bit map. The sequence processor 806 may store the computed conditions directly into the CTC cache 938*b*.

Steps 1208-1214 are performed during an operational phase. Steps 1208-1214 may be repeated each time a request to perform the memory operation is received. Step 1208 includes receiving a request to perform the memory operation. In one embodiment, command synchronizer 902 receives the request from controller 122, and provides the request to sequence processor 806.

Step 1210 includes accessing the stored information for the at least one segment. In some embodiments, the information is stored on a sub-clock basis. It is not required that step 1210 be performed for all sub-clocks of the memory operation. In one embodiment, the core processor 802 accesses the information from the CTC cache 938*b*. In one embodiment, the sequence processor 806 accesses the information from CTC cache 938*a*.

Step 1212 includes setting or resetting one or more CTC signals for the at least one segment based on the stored information that was accessed in step 1210. As noted above, in one embodiment step 1210 is performed for at least one sub-clock of the memory operation. Hence, step 1212 is not required to be performed for all sub-clocks of the memory operation. In the event that steps 1210 and 1212 are not performed for a sub-clock, setting or resetting of the CTC signals (for other sub-clocks) may be performed based on computations performed at runtime.

Step 1214 includes using the CTC signals to control the at least one segment of the memory operation. Step 1214 may also include using CTC signals that were computed at runtime to control other segments of the memory operation.

Process 1200 may be modified such that steps 1202-1206 are performed during the operational phase. In this case, steps 1202-1206 may still be performed prior to receiving at least some of the memory access commands. Therefore, benefits described herein of time and/or power savings may be realized.

There are numerous ways in which pre-computed information may be used to generate CTC signals. For example, the pre-computed information might be used by the sequence processor 806 at runtime. As another alternative, the pre-computed information might be used by the core processor 802 at runtime. FIGS. 13A-13D depict flowcharts of several different embodiments of generating CTC signals. Each of these processes is performed in the operational phase.

Figure 13A:
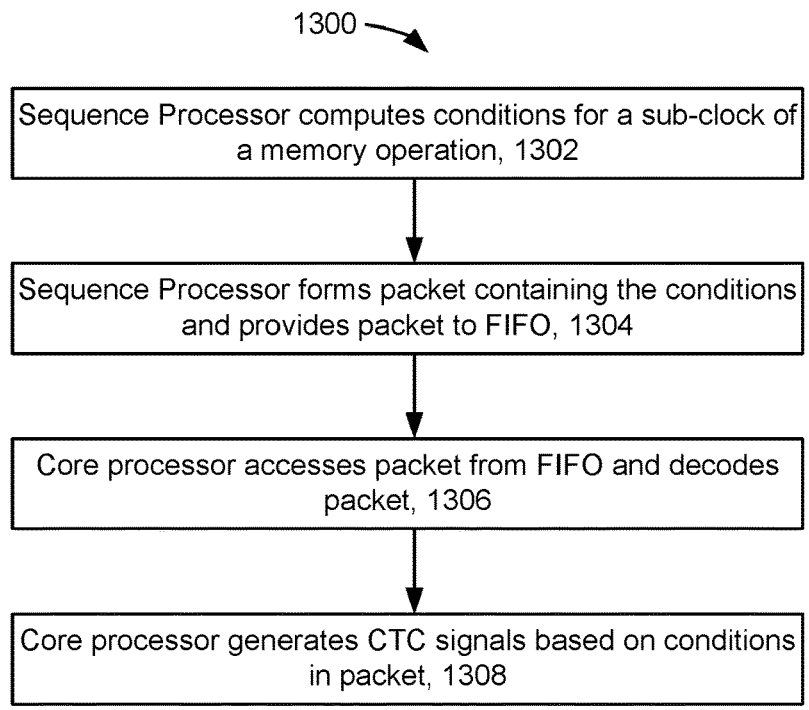
FIGS. 13A-13D depict flowcharts of several different embodiments of generating CTC signals.

FIG. 13A depicts a flowchart of a process 1300 of generating CTC signals that may be used without pre-computing information for generating CTC signals. This process could be used for a segment of a memory command for which there is adequate time to compute the information in real time, for example.

Step 1302 includes the sequence processor 806 computing conditions for a sub-clock of a memory operation. Computing the conditions may be based on a combination of modes (or sub-modes), parameters, and/or state dependent bits. As noted, this may be performed at runtime, in response to receiving a request to perform the memory operation.

Step 1304 includes the sequence processor 806 forming a packet 1100 containing the conditions. In one embodiment, the conditions are placed in the condition bit map 1110 of the packet 1100. Step 1304 also includes the sequence processor 806 providing the packet to the command FIFO 922.

Step 1306 includes the core processor 802 accessing the packet 1100. FIFO manager 924 may provide the packet 1100 to the core processor 802. Step 1306 also includes the core processor 802 decoding the packet.

Step 1308 includes the core processor 802 generating CTC signals based on the conditions in the packet. Further details of one embodiment of the core processor 802 generating CTC signals based on the conditions in the packet are discussed below in connection with FIG. 15.

Figure 13B:
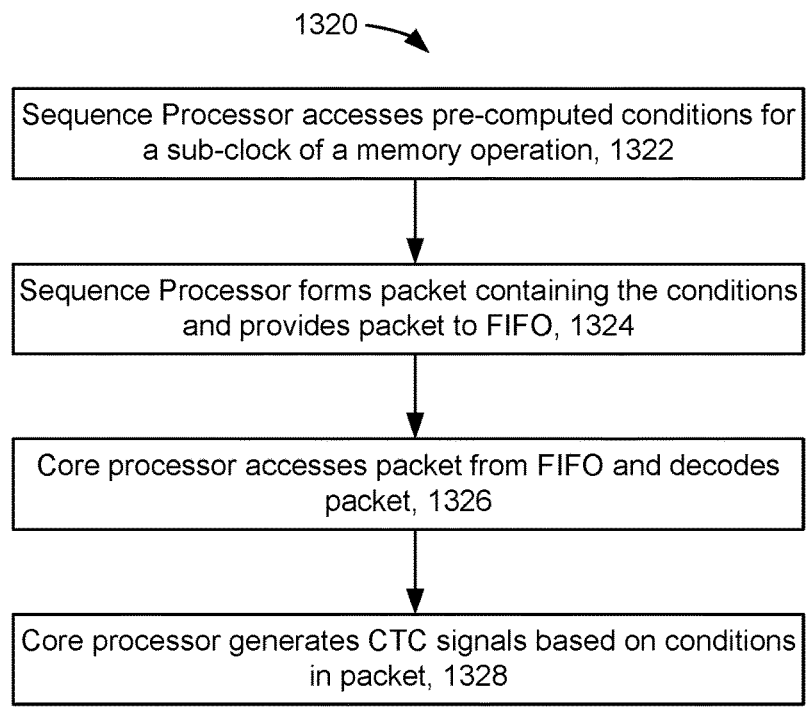

FIG. 13B depicts a flowchart of a process 1320 of generating CTC signals that may be used in conjunction with pre-computing conditions, such as the conditions in the condition bit map 1110. Thus, prior to performing process 1320, the sequence processor 806 computes the conditions, which are cached. The conditions may be cached in, for example, CTC cache 938a. In one embodiment, the conditions are pre-computed and cached during a power on phase. In one embodiment, the conditions are pre-computed and cached during an operational phase. The process 1320 may be used for a segment of a memory command for which there is not adequate time for the sequence processor 806 to compute the conditions in real time. Even if there is adequate time for the sequence processor 806 to compute the conditions in real time the process 1320 could be performed to save power.

Step 1322 includes the sequence processor 806 accessing the cached conditions for the sub-clock of the memory operation. For example, the sequence processor 806 accesses the conditions from CTC cache 938a.

Step 1324 includes the sequence processor 806 forming a packet 1100 containing the cached conditions. In one embodiment, the conditions are placed in the condition bit map 1110 of the packet 1100. Step 1324 also includes the sequence processor 806 providing the packet to the command FIFO 922.

Step 1326 includes the core processor 802 accessing the packet 1100. FIFO manager 924 may provide the packet 1100 to the core processor 802. Step 1326 also includes the core processor 802 decoding the packet.

Step 1328 includes the core processor 802 generating CTC signals based on the conditions in the packet. Further details of one embodiment of the core processor 802 generating CTC signals based on the conditions in the packet are discussed below in connection with FIG. 15.

Figure 13C:
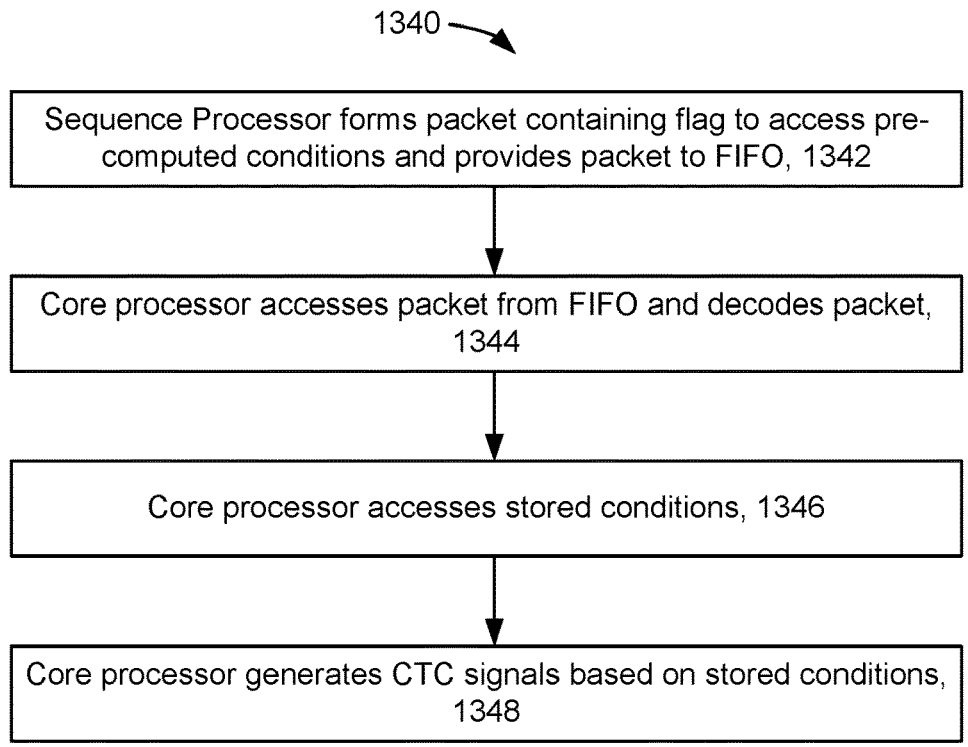

FIG. 13C depicts a flowchart of a process 1340 of generating CTC signals that may be used in conjunction with pre-computing conditions, such as the conditions in the condition bit map 1110. Thus, prior to performing process 1340, the sequence processor 806 computes the conditions, which are cached. The conditions may be cached in, for example, CTC cache 938b. In one embodiment, the conditions are pre-computed and cached during a power on phase. In one embodiment, the conditions are pre-computed and cached during an operational phase. The process 1340 may be used for a segment of a memory command for which there is not adequate time for the sequence processor 806 to compute the conditions in real time. Even if there is adequate time for the sequence processor 806 to compute the conditions in real time the process 1340 could be performed to save power.

Step 1342 includes the sequence processor 806 forming a packet 1100 containing a UC flag 1114 that is set to indicate that the core processor 802 should access the cached conditions. Step 1342 also includes the sequence processor 806 providing the packet to the command FIFO 922.

Step 1344 includes the core processor 802 accessing the packet 1100. FIFO manager 924 may provide the packet 1100 to the core processor 802. Step 1344 also includes the core processor 802 decoding the packet.

Step 1346 includes the core processor 802 accessing the cached conditions for the sub-clock of the memory operation. For example, the core processor 802 accesses the conditions from CTC cache 938b.

Step 1348 includes the core processor 802 generating CTC signals based on the cached conditions. Further details of one embodiment of the core processor 802 generating CTC signals based on the conditions in the packet are discussed below in connection with FIG. 15.

Figure 13D:
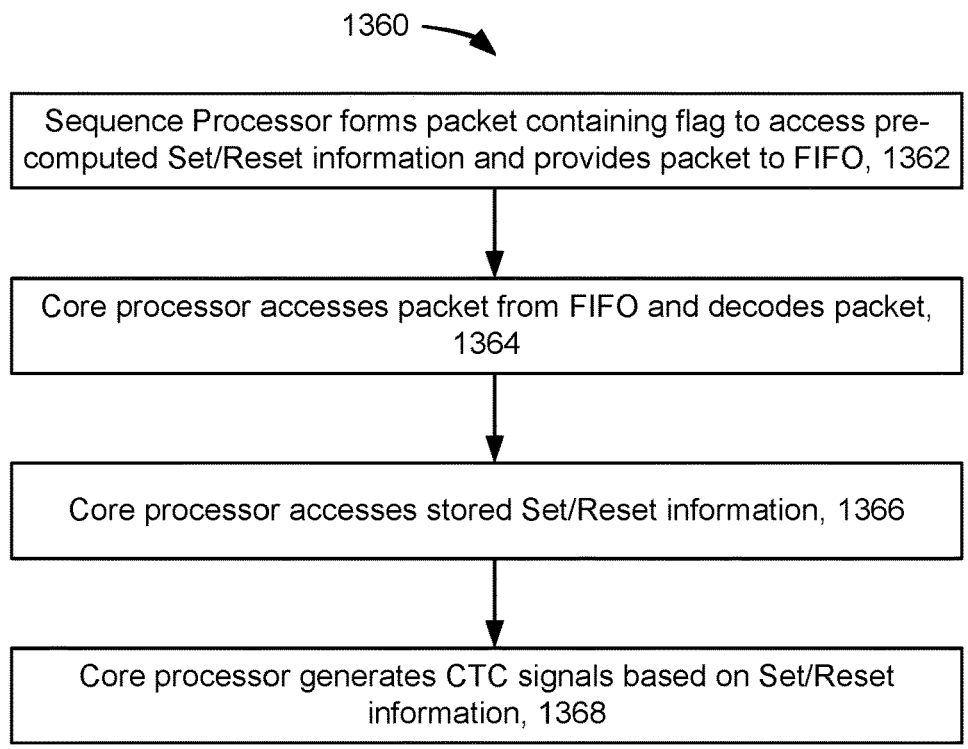

In some embodiments, rather than caching the conditions, set/reset information that specifies when voltages to be applied to the non-volatile memory structure are to be set or reset may be pre-computed and stored. This set/reset information could contain the information in the CTC signal 1002 depicted in FIG. 10A. Thus, the CTC signal could be directly generated from the set/reset information. FIG. 13D depicts a flowchart of a process 1360 of generating CTC signals that may be used in conjunction with pre-computing set/reset information. Thus, prior to performing process 1360, the set/reset information is computed and cached. The set/reset information may be cached in, for example, CTC cache 938b. In one embodiment, the set/reset information is pre-computed and cached during a power on phase. In one embodiment, the set/reset information is pre-computed and cached during an operational phase. The process 1360 may be used for a segment of a memory command for which there is not adequate time for the sequence processor 806 to compute the conditions in real time. Even if there is adequate time for the sequence processor 806 to compute the conditions in real time the process 1360 could be performed to save power.

Step 1362 includes the sequence processor 806 forming a packet 1100 containing a UC flag 1114 that is set to indicate that the core processor 802 should access the cached set/reset information. Step 1362 also includes the sequence processor 806 providing the packet to the command FIFO 922.

Step 1364 includes the core processor 802 accessing the packet 1100. FIFO manager 924 may provide the packet 1100 to the core processor 802. Step 1364 also includes the core processor 802 decoding the packet.

Step 1366 includes the core processor 802 accessing the cached set/reset information for the sub-clock of the memory operation. For example, the core processor 802 accesses the set/reset information from CTC cache 938b.

Step 1368 includes the core processor 802 generating CTC signals based on the cached conditions. For example, the core processor 802 may generated an electrical signal from the cached set/reset information. The electrical signal may be transmitted to the memory structure 126.

FIGS. 14A-14C depict details of embodiments of processing during runtime by the sequence processor 806. FIG. 14C, to be discussed after first discussing FIGS. 14A and 14B, depicts one embodiment of how stored conditions may be used at runtime by the sequence processor 806. FIG. 14A is a flowchart of one embodiment of a command level flow for the sequence processor 806. In step 1402, sequence processor 806 is waiting to receive a new command. In one embodiment, the new command has an address. In step 1404, Sequencer Processor 806 uses the address received to lookup a pointer to execution code. In step 1406, Sequencer Processor 806 executes the execution code (software/firmware) pointed to by the pointer.

FIG. 14B is a flowchart of one embodiment of a process of executing a command on sequence processor 806. That is, the process of FIG. 14B is one example implementation of step 1406 of FIG. 14A. In step 1430, sequence processor 806 updates conditions. These are parameters that such as reference voltages, mode of operation, etc. Based on these conditions and the current command being performed, step 1432 includes updating some of the bits of the Condition Bit Map 1110 of command packet 1100. In step 1434, sequence processor 806 triggers parameter manager 906 to update the parameters used for the current command (via parameter control signal 934). In step 1436, sequence processor 806 sets the system to be on the first sub-clock of the main clock for the current command. In step 1438, sequence processor 806 implements the sequence for the current sub-clock. If the current sub-clock is the last main clock (step 1440) for the current command, then the process of FIG. 14B is completed (step 1442). However, if the current main clock is not the last main clock for the current command (step 1440), then the process of FIG. 14B continues at step 1406 with system set to the next main clock for the current command.

FIG. 14C is a flowchart of one embodiment of a sub-clock flow performed by sequence processor 806. That is, the process of FIG. 14C is one example implementation of step 1438 of FIG. 14B. In step 1470, the index that indicates the current sub-clock (e.g., Sub_clk) is set to 1. In step 1472, configuration information for the current sub-clock is loaded. The sub-clock flow performed by Sequencer Processor 806 included calculating many conditions used to determine the control signals for the memory structure. Step 1474 includes determining whether the conditions should be computed now, or accessed from storage.

If the conditions are to be computed now, then the sequence processor 806 executes instructions to compute the conditions. Using the sequence processor 806 to calculate the parameter/condition (step 1476) is likely to take multiple clock cycles.

If the conditions are to accessed from storage, then the sequence processor 806 accesses the conditions from storage in step 1478. For example, sequence processor 806 accesses the conditions from CTC cache 938a. The conditions may be accessed from storage in as little as one clock cycle. Hence, many clock cycles may be saved by accessing the conditions from storage, relative to computing the conditions.

In step 1480, sequence processor 806 builds the command packet 1100 by inserting the bits into the Condition Bit Map of the command packet 1100. In step 1482, command packet 1100 is sent from sequence processor 806 to CMD FIFO 922, where it is accessed by FIFO manager 924 for distribution to core processor 802 so that the conditions in command packet 1100 can be used by core processor 802 to generate the control signals to operate non-volatile memory structure 126. If there are more command packets to send for the current sub-clock (step 1484), then the process of FIG. 14C continues at step 1486. Step 1486 is to increment the sub-clock index. Then, control passes to step 1472. If there are no more command packets to send for the current sub-clock (step 1484), then the process of FIG. 14C is completed at step 1488.

Figure 15:
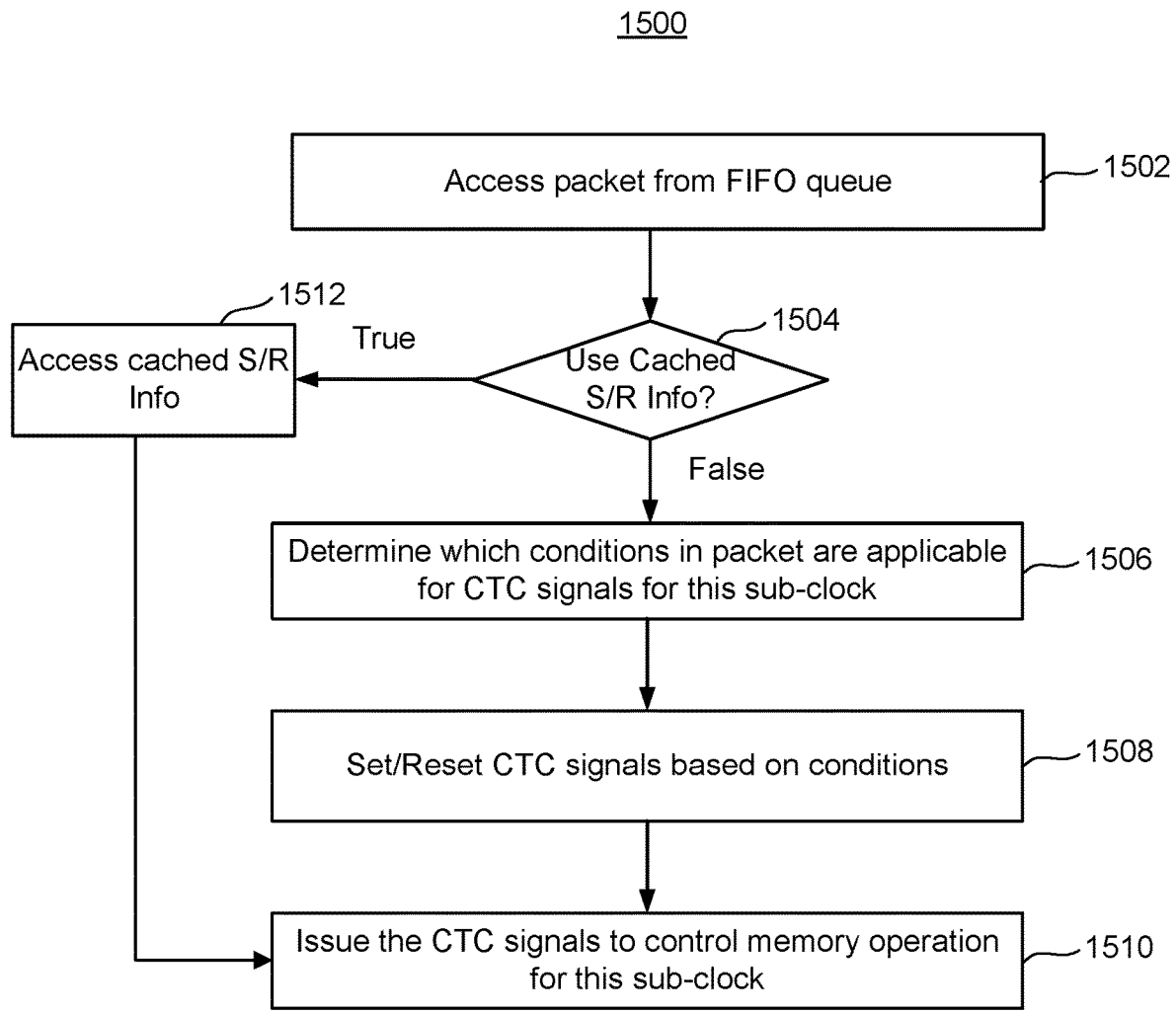
FIG. 15 is a flowchart of one embodiment of a process of processing a packet in order to generate CTC signals.

As noted above, in some embodiments, the core processor 802 may access stored pre-computed information in order to save time and/or power. The stored pre-computed information may be used by the core processor 802 to generate CTC signals. FIG. 15 is a flowchart of one embodiment of a process 1500 of processing a packet 1100 in order to generate CTC signals. The process 1500 may be performed for one segment (e.g., sub-clock) of a memory operation. The process 1500 is performed by MCU 112, in one embodiment. The process 1500 is performed by core processor 802, in one embodiment. Reference will be made to the packet 1100 in FIG. 11A, but process 1500 is not limited to the packet in FIG. 11A.

Step 1502 includes accessing a packet from the CMD FIFO queue 922. In some cases, the packet is for a segment for which pre-computed information is not accessed. In this case, the packet may contain condition bit map 1110 to indicate conditions, which may have been computed by the sequence processor 806. The conditions may have been determined by the sequence processor 806 in real time. Note that this option refers to a memory operation (or segment thereof) in which store pre-computed conditions are not being used. In some cases, the packet is for a segment for which pre-computed information is accessed. In this case, the packet need not contain a valid condition bit map 1110.

Step 1504 is a determination of whether to use cached Set/Reset information to generate CTC signals or to generate the CTC signals based on conditions specified in the packet. In one embodiment, the packet 1100 comprises a UC flag 1114 that indicates whether the Set/Reset information should be accessed from the storage.

In the event that the cached Set/Reset information is not to be used, then control passes to step 1506. Step 1506 includes determining which conditions are applicable for the group of CTC signals for a segment of the memory operation. Step 1506 includes determining which of the conditions will impact the CTC signals needed for the sub-clock of the memory operation. In one embodiment, the MCU 112 stores a local static bit map that indicates which conditions will impact the CTC signals needed for the sub-clock of the memory operation. In one embodiment, the MCU 112 stores a local static bit map for each sub-clock. In one embodiment, the core processor uses the data in the sub-clock field 1104 of the packet 1100 to access a specific local static bit map for that sub-clock. In one embodiment, the core processor compares (e.g., performs a logical AND) between the conditions 1110 in the packet 1100 and the local static bit map to determine which of the conditions 1110 in the packet 1100 will impact the CTC signals.

Step 1508 includes setting or resetting CTC signals based on the conditions. In one embodiment, the MCU 112 has a set/reset array that as a Set bit and a Reset bit for each control signal. In one embodiment, the core processor either sets or resets the bits in the set/reset array based on the result of step 1506. In one embodiment, the core processor writes a "1" to the set bit for a control signal to indicate that the control signal should be set (e.g., move from a low value to a high value) for this sub-clock. If the control signal is not to be set, then the value of the set bit is "0". In one embodiment, the core processor writes a "1" to the reset bit for a control signal to indicate that the control signal should be reset (e.g., move from a high value to a low value) for this sub-clock. If the control signal is not to be reset, then the value of the reset bit is "0".

Step 1510 also includes issuing the CTC signals to the memory structure 126 to control the memory operation for this sub-clock. Step 1510 may include forming CTC signals from the Set/Reset information. Step 1510 may include examining the set/reset array for any bits having a value of "1", which indicates that the corresponding control signal should either be set or reset this sub-clock.

Step 1512 is performed when cached Set/Reset information is to be used (step 1504 is true). Step 1512 includes accessing cached Set/Reset information from storage. In one embodiment, the core processor 802 accesses the Set/Reset information from CTC cache 938b. In one embodiment, the cached Set/Reset information for this sub-clock is similar to the Set/Reset array discussed in connection with step 1508. Thus, rather than computing the Set/Reset array in steps 1506-1508 based on the conditions 1110 in the packet 1100, the Set/Reset information may simply be accessed. Accessing the Set/Reset information may take as little as one clock cycle. In contrast, steps 1506-1508 may take multiple clock cycles.

After step 1512, control passes to step 1510. Step 1510 includes forming CTC signals from the Set/Reset information. Step 1510 also includes issuing the CTC signals to the memory structure 126 to control the memory operation for this sub-clock.

In some cases, there may be dynamic conditions that may affect the CTC signals. A dynamic condition refers to a condition that can only be determined at runtime. An example of a dynamic condition is operating temperature. Runtime refers to the time after the power on phase when requests to perform memory operations are received by the MCU 112. Therefore, in one embodiment, a dynamic condition cannot be factored in to the pre-computation of the conditions that are determined at, for example, power on. However, the pre-computed conditions may be modified based on the dynamic condition. In one embodiment, the MCU 112 determines one or more dynamic conditions at runtime. In one embodiment, the MCU 112 determines at least one of the dynamic conditions after the memory operation for which CTC signals are to be generated is received. In one embodiment, the MCU 112 generates the CTC signals based on the cached information and further on the one or more dynamic conditions. For example, with reference to FIG. 13A, the sequence processor 806 may modify one or more bits in the pre-computed conditions that were accessed in step 1322 based on the one or more dynamic conditions. Although this may slightly increase the time to perform step 1322, considerable time may be saved relative to performing the entire computation at runtime. Other techniques may be used to use dynamic conditions to impact the generation of the CTC signals. In one embodiment, the core processor 802 accesses the cached conditions and modifies one or more bits in the cached conditions based on the one or more dynamic conditions.

Accordingly, it can be seen that, in a first embodiment, an apparatus is provided that includes a memory structure comprising non-volatile memory cells and a control circuit connected to the memory structure. The control circuit is configured to generate and apply control signals to the memory structure to perform memory operations. The control circuit comprises a microcontroller configured to execute instructions to determine information for generating the control signals for a type of memory operation prior to receiving a request to perform a memory operation of the type of memory operation. The microcontroller is configured to cache the information for the type of memory operation. The microcontroller is configured to access the information and generate the control signals based on the cached information in response to receiving a request to perform a memory operation of the type of memory operation. The microcontroller is configured to apply the control signals generated based on the cached information to the memory structure to perform the memory operation.

In a second embodiment, in furtherance to of the first embodiment, the information comprises conditions that are relevant for the non-volatile memory structure and from which the control signals for the type of memory operation are derivable. The cached information comprises cached conditions that are relevant for the non-volatile memory structure.

In a third embodiment, in furtherance to any of the first to second embodiments, the microcontroller is further configured to determine, after receiving the request, the control signals based on the cached conditions and information that is specific to the type of memory operation.

In a fourth embodiment, in furtherance to any of the first to third embodiments, the microcontroller comprises a first processor configured to execute a first set of instructions to form a packet that contains a flag that indicates the cached conditions are to be accessed. The microcontroller comprises a second processor configured to execute a second set of instructions to access the packet. The second processor is configured to execute the second set of instructions to access the cached conditions and to generate the control signals based on the cached conditions.

In a fifth embodiment, in furtherance to any of the first to fourth embodiments, the microcontroller comprises a first processor configured to execute a first set of instructions to access the cached conditions. The first processor is configured to execute the first set of instructions to form a packet that contains the cached conditions. The microcontroller comprises a second processor configured to execute a second set of instructions to access the packet. The second processor is configured to execute the second set of instructions to generate the control signals based on the conditions in the packet.

In a sixth embodiment, in furtherance to any of the first to fifth embodiments, the information comprises set/reset information that specifies when the control signals are to be set or reset. The cached information comprises cached set/reset information.

In a seventh embodiment, in furtherance to any of the first to sixth embodiments, the microcontroller is further configured to apply the control signals to control the non-volatile memory structure based on the cached set/reset information.

In an eighth embodiment, in furtherance to any of the first to seventh embodiments, the microcontroller comprises a first processor configured to execute a first set of instructions to form a packet that contains a flag that indicates the cached set/reset information is to be accessed. The microcontroller comprises a second processor configured to execute a second set of instructions to access the packet. The second processor is configured to execute the second set of instructions to access the cached set/reset information and to generate the control signals based on the cached set/reset information.

In a ninth embodiment, in furtherance to any of the first to eighth embodiments, the microcontroller is further configured to execute the instructions during a power on phase of the non-volatile storage apparatus to determine the information for generating the control signals for the type of memory operation.

In a tenth embodiment, in furtherance to the any of the first to ninth embodiments, the microcontroller is further configured to access stored parameters during a power on phase of the non-volatile storage apparatus. The microcontroller is further configured to execute the instructions during the power on phase to determine the information for generating the control signals for the type of memory operation based on the stored parameters.

In an eleventh embodiment, in furtherance to any of the first to tenth embodiments, the microcontroller is further configured to determine a dynamic condition after the memory operation is received. The microcontroller is further configured to generate the control signals based on the cached information and further on the dynamic condition.

Accordingly, it can be seen that one embodiment includes a method of operating a non-volatile memory system. The method comprises accessing parameters from storage in the non-volatile memory system. The method comprises executing instructions on a processor in the non-volatile memory system to compute information that is applicable to core timing control signals to be applied to a non-volatile memory structure in the non-volatile memory system during a segment of a memory operation, including using the parameters to compute the information prior to the non-volatile memory system receiving a request to perform the memory operation. The method comprises storing the computed information in storage in the non-volatile memory system. The method comprises accessing the stored information in response to receiving a request to perform the memory operation. The method comprises setting or resetting one or more core timing control signals based on the stored information. The method comprises using the core timing control signals to control the non-volatile memory structure during the segment of the memory operation.

Accordingly, it can be seen that one embodiment includes a non-volatile storage system. The non-volatile storage system comprises a memory die comprising a control circuit and a memory structure comprising non-volatile memory cells. The control circuit is configured to generate and apply a set of control signals to control the memory structure to perform memory operations. The control circuit comprises a first processor configured to execute first instructions to compute conditions for a segment of a memory operation. The control circuit comprises a second processor configured to execute second instructions to generate control signals for the segment of the memory operation based on the conditions. The first processor is configured to pre-compute the conditions for the segment of the memory operation prior to receiving a request to perform the memory operation, wherein the control circuit is configured to store the pre-computed conditions. The control circuit is configured to access the stored pre-computed conditions in response to receiving a request to perform the memory operation. The second processor is configured to execute the second instructions generate the control signals for the segment of the memory operation based on the stored pre-computed conditions.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a memory structure comprising non-volatile memory cells; and
   a control circuit connected to the memory structure, the control circuit configured to generate and apply control signals to the memory structure to perform memory operations, the control circuit comprising:
      a microcontroller configured to:
         execute instructions to determine conditions for generating the control signals for one or more sub-clocks of a type of memory operation prior to receiving a request to perform a memory operation of the type of memory operation;
         cache the conditions for the type of memory operation;
         access the conditions for a sub-clock of a type of memory operation in response to receiving a request to perform a memory operation of the type of memory operation;
         identify a set of the accessed conditions for the sub-clock of the type of memory operation;
         generate the control signals for the sub-clock of the type of memory operation based on the identified conditions; and
         apply the control signals for the sub-clock of the type of memory operation to the memory structure to perform the memory operation.

2. The non-volatile storage apparatus of claim 1, wherein the conditions for a sub-clock are based on a combination of a mode of the type of memory operation, a sub-mode of the type of memory operation, a parameter that specifies an option that can be applied during the type of memory operation, and/or a state dependent bit that defines how a flow of the control signals are to proceed for the type of memory operation.

3. The non-volatile storage apparatus of claim 1, wherein the microcontroller is further configured to:
  determine, after receiving the request, the control signals based on the cached conditions and a bitmap that indicates which of the cached conditions will impact the control signals for the sub-clock of the type of memory operation information.

4. The non-volatile storage apparatus of claim 1, wherein the microcontroller comprises:
  a first processor configured to execute a first set of instructions to form a packet that contains a flag that indicates the cached conditions are to be accessed; and
  a second processor configured to execute a second set of instructions to access the packet, the second processor configured to execute the second set of instructions to access the cached conditions and to generate the control signals based on the cached conditions.

5. The non-volatile storage apparatus of claim 1, wherein the microcontroller comprises:
  a first processor configured to execute a first set of instructions to access the cached conditions, the first processor configured to execute the first set of instructions to form a packet that contains the cached conditions; and
  a second processor configured to execute a second set of instructions to access the packet, the second processor configured to execute the second set of instructions to generate the control signals based on the conditions in the packet.

6. The non-volatile storage apparatus of claim 1, wherein the microcontroller is further configured to:
  execute the conditions during a power on phase of the non-volatile storage apparatus to determine the conditions for generating the control signals for the type of memory operation.

7. The non-volatile storage apparatus of claim 1, wherein the microcontroller is further configured to:
  access stored parameters during a power on phase of the non-volatile storage apparatus; and
  execute the instructions during the power on phase to determine the conditions for generating the control signals for the type of memory operation based on the stored parameters.

8. The non-volatile storage apparatus of claim 1, wherein the microcontroller is further configured to:
  determine a dynamic condition at runtime; and
  generate the control signals based on the cached conditions and further on the dynamic condition.

9. A method of operating a non-volatile memory system, the method comprising:
  accessing parameters from storage in the non-volatile memory system;
  executing instructions on a processor in the non-volatile memory system to compute conditions that are applicable to core timing control signals to be applied to a non-volatile memory structure in the non-volatile memory system during a temporal segment of a memory operation, including using the parameters to compute the conditions prior to the non-volatile memory system receiving a request to perform the memory operation;
  storing the computed conditions in storage in the non-volatile memory system;
  accessing the stored conditions in response to receiving the request to perform the memory operation;
  setting or resetting one or more of the core timing control signals based on the stored conditions and a bitmap that indicates which of the stored conditions will impact the control signals for the temporal segment of the memory operation; and
  using the core timing control signals to control the non-volatile memory structure during the temporal segment of the memory operation.

10. The method of claim 9, wherein:
  computing the conditions comprises computing conditions from which the core timing control signals for the temporal segment of the memory operation are derivable, wherein the conditions are based on a combination of a mode of the memory operation, a sub-mode of the memory operation, a parameter that specifies an option that can be applied during the memory operation, and/or a state dependent bit that defines how a flow of the core timing control signals are to proceed for the memory operation.

11. The method of claim 9, wherein accessing the parameters and computing the conditions is performed during a power on phase of the non-volatile memory system.

12. A non-volatile storage system, comprising:
  a memory die comprising a control circuit and a memory structure comprising non-volatile memory cells, the control circuit configured to generate and apply a set of control signals to control the memory structure to perform memory operations, the control circuit comprising:
    a first processor configured to execute first instructions to compute conditions for a temporal segment of a memory operation; and
    a second processor configured to execute second instructions to generate control signals for the temporal segment of the memory operation based on the conditions;
  the first processor configured to pre-compute the conditions for the temporal segment of the memory operation prior to receiving a request to perform the memory operation, wherein the control circuit is configured to store the pre-computed conditions;
  the control circuit configured to access the stored pre-computed conditions for the temporal segment of the memory operation in response to receiving a request to perform the memory operation; and
  the second processor configured to execute the second instructions to:
    identify which of the stored pre-computed conditions will impact the control signals for the temporal segment of the memory operation; and
    generate the control signals for the temporal segment of the memory operation based on the identified pre-computed conditions.

13. The non-volatile storage system of claim 12, wherein:
  the first processor is configured to form a packet having a flag indicating that the stored pre-computed conditions are to be used to generate the control signals;
  the second processor is configured to decode the packet;
  the second processor is configured to access the stored pre-computed conditions; and
  the second processor is configured to identify which of the stored pre-computed conditions will impact the control signals for the temporal segment of the memory operation based on stored information that indicates which of the stored pre-computed conditions will impact the control signals for the temporal segment of the memory operation.

14. The non-volatile storage system of claim 12, wherein:
the first processor is configured to access the stored pre-computed conditions;
the first processor is configured to form a packet having the stored pre-computed conditions;
the second processor is configured to decode the packet; and
the second processor is configured to identify which of the stored pre-computed conditions will impact the control signals for the temporal segment of the memory operation based on the pre-computed conditions in the packet and stored information that indicates which of the pre-computed conditions in the packet will impact the control signals for the temporal segment of the memory operation.

15. The non-volatile storage system of claim 12, wherein:
the first processor is configured to pre-compute conditions for the temporal segment of the memory operation during a power on phase of the non-volatile storage system; and
the control circuit is configured to store the pre-computed conditions during the power on phase of the non-volatile storage system.

16. The non-volatile storage system of claim 12, further comprising:
an instruction loader configured to update at least one of the first instructions or the second instructions.

\* \* \* \* \*